(12) United States Patent
Amanuma

(10) Patent No.: US 6,316,801 B1
(45) Date of Patent: Nov. 13, 2001

(54) SEMICONDUCTOR DEVICE HAVING CAPACITIVE ELEMENT STRUCTURE AND MULTILEVEL INTERCONNECTION STRUCTURE AND METHOD OF FABRICATING THE SAME

(75) Inventor: Kazushi Amanuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/262,070

(22) Filed: Mar. 4, 1999

(30) Foreign Application Priority Data

Mar. 4, 1998 (JP) .................................. 10-052128

(51) Int. Cl.⁷ .................................. H01L 27/108
(52) U.S. Cl. .................. 257/306; 257/311; 257/758; 257/774
(58) Field of Search .................. 257/295, 306, 257/310, 311, 312, 758, 714; 438/253, 396

(56) References Cited

U.S. PATENT DOCUMENTS

| | | | | |
|---|---|---|---|---|
| 5,352,623 | * | 10/1994 | Kamiyama | 438/396 |
| 5,365,095 | * | 11/1994 | Shono et al. | 257/295 |
| 5,965,942 | * | 10/1999 | Itoh et al. | 257/761 |
| 5,985,731 | * | 11/1999 | Weng et al. | 438/396 |
| 5,986,299 | * | 11/1999 | Nakamura et al. | 257/296 |
| 6,049,132 | * | 4/2000 | Iwahashi et al. | 257/763 |
| 6,051,858 | * | 4/2000 | Uchida et al. | 257/295 |
| 6,198,122 | * | 3/2001 | Habu et al. | 257/296 |

FOREIGN PATENT DOCUMENTS 4-06-120447 * 4/1994 (JP) ........................................ 257/71

* cited by examiner

*Primary Examiner*—Eddie Lee
*Assistant Examiner*—George C. Eckert, II
(74) *Attorney, Agent, or Firm*—Young & Thompson

(57) ABSTRACT

A capacitive element structure in a semiconductor device having an interconnection structure. The capacitive element structure includes a capacitive element having a capacitive dielectric film made of an oxide compound. The capacitive element structure is above at least a first level interconnection of the interconnection structure.

14 Claims, 22 Drawing Sheets

SEMICONDUCTOR DEVICE HAVING CAPACITIVE ELEMENT STRUCTURE AND MULTILEVEL INTERCONNECTION STRUCTURE AND METHOD OF FABRICATING THE SAME

BACKGROUND OF THE INVENTION

The present invention relates to a semiconductor device having capacitive elements and semiconductor devices having metal interconnection and ferroelectric capacitance or high dielectric capacitance.

In recent years, developments of ferroelectric memories utilizing ferroelectric capacitances and dynamic random access memories utilizing high dielectric capacitances have been active. Those ferroelectric memories and dynamic random access memories have switching transistors such as MOS field effect transistors. The ferroelectric capacitor or the high dielectric capacitor is electrically connected to one of diffusion regions, for example, source/drain diffusion regions so that the ferroelectric capacitor or the high dielectric capacitor can act as a memory cell in the ferroelectric memory or the dynamic random access memory.

The ferroelectric capacitor has a capacitive dielectric film made of a ferroelectric material, for example, $Pb(Zr, Ti)O_3$, hereinafter referred to as "PZT". Upon application of an electric field to the ferroelectric capacitive film the ferroelectric capacitive film shows a polarization which enables the ferroelectric capacitor to act the non-volatile storage The high dielectric capacitor has a capacitive dielectric film made of a high dielectric material, for example, $(Ba, Sr)TiO_3$, hereinafter referred to as "BST". A high dielectric constant of the high dielectric film increases a capacitance of the high dielectric capacitor. This increase in capacitance of Ie high dielectric capacitor enables the capacitor to be scaled down.

For use of the ferroelectric capacitor or the high dielectric capacitor, it is necessary that one of electrodes of the ferroelectric capacitor or the high dielectric capacitor be connected to one of source/drain diffusion regions of switching transistor, for example, MOS field effect transistor.

In the dynamic random access memory, a bottom electrode of the capacitor may be made of a polysilicon, wherein the bottom electrode is connected to one of the source/drain diffusion regions of the switching transistors. The dielectric film is then formed on the polysilicon bottom electrode. The ferroelectric capacitive film and the high dielectric capacitive film are made of oxides, for example, $Pb(Zr, Ti)0_3$, and $(Ba, Sr)TiO_3$, respectively. For this reason, if the ferroelectric capacitive film or the high dielectric capacitive film is formed on the polysilicon bottom electrode, then a top surface of the polysilicon bottom electrode may be oxidized by the ferroelectric capacitive film or the high dielectric capacitive film. The oxidation of the bottom electrode is of course problem. In order to have attempt to solve the above problem with oxidation of the surface of the polysilicon bottom electrode with the ferroelectric capacitive film or the high dielectric capacitive film, the following conventional methods had been proposed.

The first conventional method is disclosed in 1995 Symposium On VLSI Technology Digest Of Technical Papers, pp. 123, which describes a cell structure wherein a top electrode of the capacitor is connected to the describes that an oxide dielectric film of $SrTiO_3$ is formed on an $RuO_2$/TiN bottom electrode formed on a polysilicon plug.

In accordance with the conventional methods of forming the ferroelectric memory and the dynamic random access memory, the capacitor has been formed, before a metal interconnection is then formed.

The above memory cell structure using the local interconnection or polysilicon plug connecting the capacitor to the diffusion region of the switching transistor has the following five problems.

The fist problem is in the difficulty to form multilevel metal interconnections. It is necessary to form multilevel metal interconnections in order to realize a high density integration of the ferroelectric memories having the ferroelectric thin films or the dynamic random access memories having the high dielectric thin films, or to realize a composite semiconductor device having such memory device and logic circuits. For forming the multilevel interconnections, an inter-layer insulator between adjacent different level interconnections is planarized by a chemical mechanical polishing method. However, the existence of the capacitor makes a difference in level of the inter-layer insulator between a memory cell array area having the capacitors and a logic circuit area free of any capacitor. This difference in level of the inter-layer insulator makes it difficult to planarize the surface of the inter-layer insulator. Otherwise, the difference in level of the inter-layer insulator makes it difficult to connect the adjacent different level interconnections to each other through a via hole or connect the first level interconnection to the diffusion region of the transistor through a contact hole but after the planarization to the inter-layer insulator. In Japanese laid-open patent publication No. 9-92794, it is disclosed that a difference in level of the inter-layer insulator between a memory cell area and a peripheral circuit area is reduced to form multilevel interconnections with reduced resistances on the peripheral circuit area. In accordance with this conventional method, after the via hole or the, contact hole has beer formed in the inter-layer insulator, then an electrically conductive material is deposited to fill the via hole or the contact hole and also to overly the inter-layer insulator, before the deposited conductive material is selectively etched to leave the same only within the via hole or the contact hole whereby the surface of the inter-layer insulator is shown. It is, however, difficult to realize a highly accurate etching to the electrically conductive material so that the electrically conductive material remains only the contact hole or the via hole without any over-etching to the surface of the inter-layer insulator.

The second problem is in an increase in the design cost for realizing the hybrid semiconductor integrated circuits having the logic circuits and the a semiconductor memories In order to settle the above first problem, it is required to change the process and device of the logic circuits. This means that the design parameters already used are no longer usable to other process.

The third problem is in deterioration in electrical characteristics of the capacitor or due to the process for forming the multilevel metal interconnections. Normally, a tungsten plug is formed in a via hole for connecting the adjacent different level metal interconnections. The tungsten film may be formed by utilizing, the following chemical reaction.

$$2WF_6 + 3SiH_4 \rightarrow 2W + 3SiH_4 + 6F_4.$$

The formation of the tungsten film is carried out in an extremely strong reduction atmosphere. Since the ferroelectric thin film and the high dielectric thin film are made, of oxides, exposure of the ferroelectric, thin film and the high dielectric thin film to the reduction atmosphere causes an oxygen deficiency of the ferroelectric thin film or the high dielectric thin film as the capacitive thin film whereby a resistance of the capacitive thin film is dropped whilst a leakage of current across the capacitive thin film increases. The oxygen deficiency further causes reductions in polarization of the ferroelectric film and in dielectric constant of the high dielectric film. The oxygen deficiency deteriorates the electrical characteristic of the capacitor.

In Japanese laid-open patent publication No. 9-199679, it was proposed to a, avoid the use of the reducing atmosphere for burying a metal into a deep contact hole. Plug contacts made of a thermally stable metal have been formed within openings which reach diffusion regions of CMOS circuits and memory circuits, before a ferroelectric capacitor is formed which is connected through some of the plug contacts to the diffusion regions, and further aluminum interconnections are formed in contact with the remaining ones of the plug contacts. The formation of this structure needs complicated processes. This conventional structural feature is applicable but only to the first level metal interconnection.

The fourth problem is in deterioration of characteristics of the switching transistors, for example, variation in threshold voltage of the switching transistors and deterioration in sub-threshold characteristic of the switching transistor. A gate oxide film of the MOS field effect transistor may receive substantive damage from plasma during plasma etching process, whereby interface states and fixed charges are formed in the gate oxide film of the MOS field effect transistor. Those interface states and fixed charges cause variations in threshold voltage of the switching transistors and deterioration in sub-threshold characteristic of the MOS field effect transistor.

In order to solve the above fourth problem, a hydrogen anneal in an atmosphere containing hydrogen has been carried out. If, however, this anneal as the heat treatment is carried out after the ferroelectric capacitor having the ferroelectric thin film or the high dielectric capacitor having the high dielectric thin film has formed, then a diffusion of hydrogen may be caused whereby the ferroelectric thin film or the high dielectric thin film may be exposed to hydrogen. This exposure of the ferroelectric thin film or the high dielectric thin film to hydrogen causes the oxygen deficiency of the ferroelectric thin film or the high dielectric thin film as described in the third problem, whereby the resistance of the capacitive thin film is dropped whilst the leak of current across the capacitive thin film increases. The oxygen deficiency further causes reductions in polarization of the ferroelectric a film and in dielectric constant of the high dielectric film. The oxygen deficiency deteriorates the electrical characteristic of the capacitor.

In Japanese laid-open patent publication No. 7-111318, it is disclosed that a hydrogen barrier layer such as an $Si_3N_4$ layer is provided over the capacitor to prevent diffusion of hydrogen toward the ferroelectric thin film or the high dielectric thin film, whereby deterioration of the capacitor is prevented.

This technique may, however, raise another problem with increase in manufacturing cost due to additional processes for forming the hydrogen barrier layer.

Further, responsive to the requirements for increase the density of integration of the capacitors and scaling down of the capacitor, it is required to reduce the thickness of the hydrogen barrier layer. However, the reduction in thickness of the hydrogen barrier layer results in reduction in barrier ability. This technique is irresponsible to the advanced and future semiconductor devices in consideration of the fact that the importance for reducing variations in characteristics of the devices has been on the increase, as the scale of the integrated circuits is further enlarged and high speed performance of the integrated circuits is further improved and also individual devices are scaled down.

The fifth problem is in deterioration in characteristic of the capacitor and an increase in resistance of the interconnection between the capacitor and other device. This fifth problem is raised when a contact between the different level metal interconnections or a contact between the first level metal interconnection and the semiconductor substrate is formed after the capacitor has been formed. After the contact plug is formed in an inter-layer insulator for connecting the substrate to the first level metal interconnection, an ion-implantation to the contact plug is carried out to reduce a resistance of the contact plug between the substrate and the first level metal interconnection. After the ion-implantation into the contact plug, a heat treatment is further carried out at a temperature of about 70° C. or higher for activation of the implanted ions in the contact plug. The heat treatment is thus us carried out, after the ferroelectric capacitor or the high dielectric capacitor has been formed. Such the heat treatment, however, may cause an inter-reaction and an inter-diffusion between the ferroelectric oxide material of the ferroelectric capacitive thin film or the high dielectric capacitive thin film and the electrode or the metal interconnection. Such inter-reaction and inter-diffusion cause deterioration of the electric characteristics of the capacitor is and also cause increase in resistance of the metal interconnection.

In prior art, there was neither ferroelectric memory device nor high dielectric capacitance dynamic random access memory device, which has the multilevel metal interconnection structure but is free from any of the above five problems.

In the above circumstances, it had been required to develop a novel semiconductor memory device having a ferroelectric capacitor and a multilevel interconnection structure free from the above five problems, and also develop another novel semiconductor memory device having a high dielectric capacitor and a multilevel interconnection structure free from the above five problems.

SUMMARY OF THE INVENTION

Accordingly, it is an object of the present invention to provide a novel free from is the above problems.

It is a further object of the present invention to provide a novel.

It is a still further object of the present invention to provide a novel.

It is yet a further object of the, present invention to provide a novel.

It is a further more object of the present invention to provide a novel.

It is still more object of the present invention to provide a novel.

It is yet another object of the present invention to provide a novel.

It is another object of the present invention to provide a novel.

It is still another object of the present invention to provide.

It is yet another object of the present invention to provide.

It is further another object of the present invention to provide.

It is an additional object of the present invention to provide.

It is a still additional object of the present invention to provide.

It is yet an additional object of the present invention to provide.

It is a further additional object of the present invention to provide.

It is also additional object of the present invention to provide.

It is also additional object of the present invention to provide.

The present invention provides a capacitive element structure in a semiconductor device having an interconnection structure, the capacitive element structure comprising a capacitive element having a capacitive dielectric film made of an oxide compound wherein the capacitive element structure is positioned above at least a bottom level interconnection of the interconnection structure.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
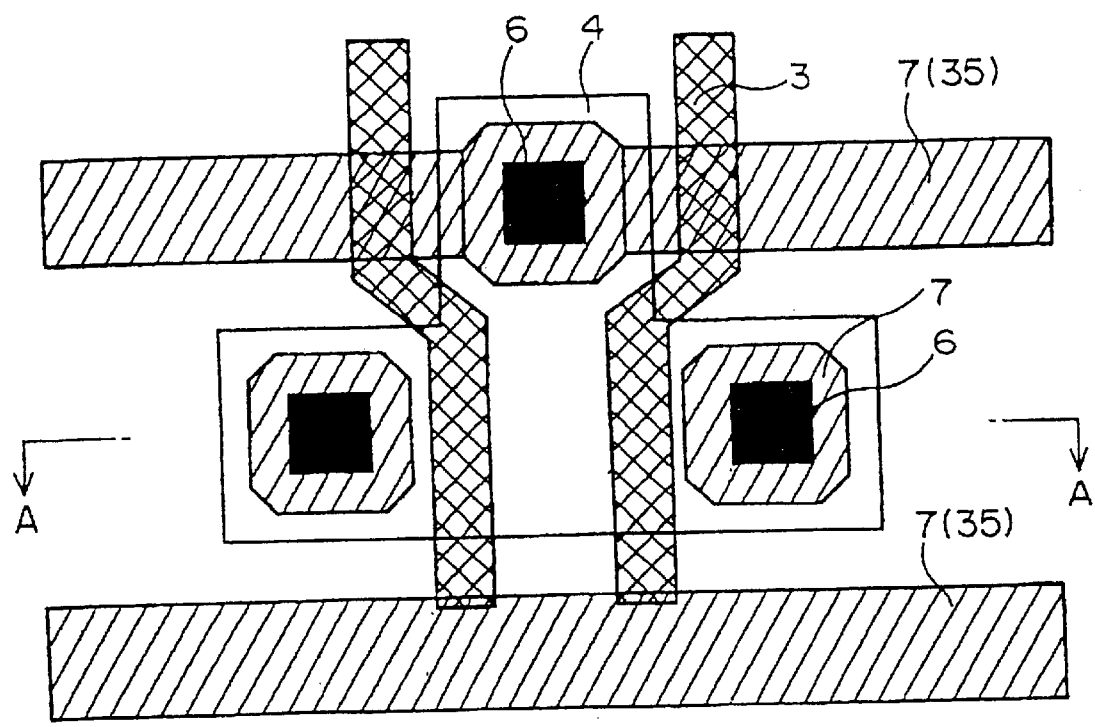
FIG. 1A is a fragmentary plane view illustrative of a memory cell of a ferroelectric memory or a, dynamic random access memory at a lower part than a first level metal interconnection of a multilevel metal interconnection structure of the ferroelectric memory or the dynamic random access memory.

The first present invention provides a capacitive element structure in a semiconductor device having an interconnection structure, the capacitive element structure comprising a capacitive element having a capacitive dielectric film made of an oxide compound, wherein the capacitive element structure is positioned above at least a bottom level interconnection of the interconnection structure.

It is preferable that the interconnection structure comprises a multilevel interconnection structure.

It is also preferable that the capacitive element structure is positioned above a top level interconnection of the multilevel interconnection structure.

It is also preferable that the capacitive element structure is positioned above at least a bottom level interconnection of the interconnection structure level interconnection of the multilevel interconnection structure.

It is also preferable that the interconnection structure comprises a single level interconnection structure and the capacitive element structure is positioned above the single level interconnection structure.

It is also preferable that the capacitive element has a bottom electrode positioned just over a contact plug just over the at least bottom level interconnection of the interconnection structure so that the bottom electrode is electrically connected through the contact plug to the at least bottom level interconnection of the interconnection structure.

It is also preferable that the interconnection structure comprises a multilevel interconnection structure, and the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug centrically corresponds to a horizontal position of the at least via plug.

It is also preferable that the interconnection structure comprises a multilevel interconnection structure, and the capacitive element structure is positioned at above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned above the at least via plug so that a horizontal position of the at least contact plug is eccentrically displaced from a horizontal position of the at least via plug.

It is also preferable that the interconnection structure comprises a multilevel interconnected structure, and the capacitive element structure is positioned above at least a second bottom level interconnection of the interconnection structure and positioned below at least a top level interconnection of the multilevel interconnection structure, and the at least second bottom level interconnection and a first bottom level interconnection of the interconnection structure are connected to each other through a via plug, and that the capacitive element has a bottom electrode positioned just over a bottom contact plug just over the at least second bottom level interconnection of the interconnection structure so that the bottom electrode is electrically connected through the bottom contact plug to the at least second bottom level interconnection of the interconnection structure, and that the capacitive element has a top electrode positioned just under a top contact plug just under a just upper level interconnection of the interconnection structure so that the top electrode is electrically connected through the top contact plug to the at least just upper level interconnection of the interconnection structure and that a horizontal position of the top contact plug centrically corresponds to a horizontal position of the bottom contact plug.

It is also preferable that the interconnection structure comprises a multilevel interconnection structure, and the capacitive element structure is positioned above at least a second bottom level interconnection of the interconnection structure and positioned below at least a top level interconnection of the multilevel interconnection structure, and the at least second bottom level interconnection and a first bottom level interconnection of the interconnection structure are connected to each other through a via plug, and that the capacitive element has a bottom electrode positioned just over a bottom contact plug just over the at least second bottom level interconnection of the interconnection structure so that the bottom electrode is electrically connected through the bottom contact plug to the at least second bottom level interconnection of the interconnection structure, and that the capacitive element has a top electrode positioned just under a top contact plug just under a just upper level interconnection of the interconnect on structure so that the top electrode is electrically connected through the top contact plug to the at least just upper level interconnection of the interconnection structure and that a horizontal position of the top contact plug is eccentrically displaced from a horizontal position of the bottom contact plug.

It is also preferable that the capacitive element has a bottom electrode positioned just over a contact plug just over the at least bottom level interconnection of the interconnection structure so that the bottom electrode is electrically connected through the contact plug to the at least bottom level interconnection of the interconnection structure, and that the contact plug is centrically, positioned with reference to the capacitive element.

It is also preferable that the capacitive element has a bottom electrode positioned just over a contact plug just over the at least bottom level interconnection of the interconnection structure, and that the bottom electrode is electrically connected through the contact plug to the at least bottom level interconnection of the interconnection structure, and that the contact plug is eccentrically positioned with reference to the capacitive element.

It is also preferable that the interconnection structure comprises a multilevel interconnection structure, and the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that position of the at least contact plug centrically corresponds to a horizontal position of the at least via plug, and that the at least contact plug and the at least via plug are centrically positioned with reference to the capacitive element.

It is also preferable that the interconnection structure comprises a multilevel interconnection structure, and the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contract plug centrically corresponds to a horizontal position of the at least via plug, and that the at least contact plug and the at least via plug are eccentrically positioned with reference to the capacitive element.

It is also preferable that the interconnection structure comprises a multilevel interconnection structure, and the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug is eccentrically displaced from a horizontal position of the at least via plug, and that the at least contact plug is eccentrically positioned with reference to the capacitive element whilst the at least via plug is centrically positioned with reference to the capacitive element.

It is also preferable that the interconnection structure comprises a multilevel interconnection structure, and the capacitive clement structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact top plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug is eccentrically displaced from a horizontal position of the at least via plug, and that the at least contact plug is centrically positioned with reference to the capacitive element whilst the at least via plug is eccentrically positioned with reference to the capacitive element.

It is also preferable that the oxide compound possesses at least any one of thermoelectric property and high dielectric property.

It is also preferable that the oxide compound is a ceramic.

It is also preferable that the capacitive element comprises a thin film capacitor.

It is further preferable that the thin film capacitor comprises top and bottom thin film electrodes and a dielectric thin film having the same area as the top and bottom thin film electrodes.

It is also preferable to farther comprise at least a diffusion barrier layer being provided between the capacitive element and the at least interconnection structure.

It is also preferable that the interconnection structure comprises a multilevel interconnection structure, and the capacitive element structure is positioned at above a second top level interconnection of the multilevel interconnection structure and below a top level interconnection of the multilevel interconnection structure, and that the top level interconnection has a terminal portion rigidly projecting in a downward direction, so that the terminal portion has a hollow and a bottom surface having the same level as a bottom of the capacitive element structure and the bottom surface is connected through a top level interconnection contact plug to the second top level interconnection. It is also preferable that the interconnection structure comprises a multilevel interconnection structure, and the capacitive element structure is positioned above a second, top level interconnection of the multilevel interconnection structure and below a top level interconnection of the multilevel interconnection structure and that the top level interconnection has a terminal portion rigidly projecting in a downward direction, so that the terminal portion has a hollow and a bottom surface having the same level as a top surface of the second top level interconnection of the multilevel interconnection structure whereby the bottom surface is in contact directly with the top surface of the second top level interconnection of the multilevel interconnection structure.

It is also preferable that the interconnection structure is made of a metal consisting essentially of at least any one of aluminum and copper.

It is also preferable that the interconnection structure is made of a refractory metal.

In accordance with the present invention, the ceramic thin film capacitor is positioned above the multilevel interconnection structure so that the ceramic thin film capacitor is connected through the multilevel interconnection structure to the diffusion region of the transistor formed in the substrate. This structure makes it easy to form the multilevel interconnection structure and also makes it possible to prevent any deterioration of the capacitive element.

The multilevel interconnection structure is positioned below the capacitive element for which reason individual level interconnections of the multilevel interconnection structure are free from the above mentioned first problem, with differences in level of a top surface of the inter-layer insulator on which the interconnections are formed.

The multilevel interconnection structure has been formed before the capacitive element is formed, for which reason the capacitive element is free from thus a above mentioned third problem with deterioration in electrical characteristics due to tungsten via plugs.

The anneal in hydrogen containing atmosphere is carried out after the multilevel interconnection structure has been formed and before the capacitive element will be formed later, for which reason the capacitive element is free from the above mentioned fourth problem with deterioration in electrical characteristics due to a relatively high temperature heat treatment.

The ceramic thin film capacitor is positioned above the multilevel interconnection structure so that the ceramic thin film capacitor have design parameters independent from and non-associated from the logic circuit parameters, for which reason the above device is free from the above mentioned second problem in an increase in the design cost for realizing The hybrid semiconductor integrated circuits having the logic circuits and he semiconductor memories by change the process and device of the logic circuits The multilevel interconnection structure has been formed before the capacitive element is formed for which reason the capacitive element is free from through above mentioned fifth problem with deterioration in electrical characteristic due to the heat treatment for ion activation process.

The second present invention provides a semiconductor memory device comprising: a semiconductor substrate having at least an active region having at least a diffusion region; a multilevel interconnection structure being provided on the semiconductor substrate, and the multilevel interconnection structure which has different level interconnections being isolated by at least an inter-layer insulator and being electrically connected to each other through at least a via plug in at least a via hole formed in the at least inter-layer insulator, and a bottom level interconnection of the multilevel interconnection structure being electrically connected to the diffusion region on through at least a lower contact plug in at least a lower contact hole formed in the inter-layer insulator; and at least a capacitive element structure comprising a capacitive element having a capacitive dielectric film made of an oxide compound, and the at least capacitive element structure being isolated form the multi-level interconnection structure by the inter-layer insulator, wherein the capacitive element structure is positioned above at least a bottom level interconnection of the interconnection structure, and the capacitive element has a bottom electrode positioned just over a bottom contact plug just over the at least bottom level interconnection of the interconnection structure so that the bottom electrode is electrically connected through the bottom contact plug to the at least bottom level interconnection of the interconnection structure.

It is also preferable that the capacitive element structure is positioned above a top level interconnection of the multilevel interconnection structure.

It is also preferable that the capacitive element structure is postponed above at least a bottom level interconnection of the interconnection structure and below at least a top level interconnection of the multilevel interconnection structure.

It is also preferable that the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug, just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least via plug.

It is also preferable that the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned above the at least via plug so that a horizontal position of the at least contact plug is eccentrically displaced from a horizontal position of the least via plug.

It is also preferable that the capacitive element structure is positioned above at least a second bottom level interconnection of the interconnection structure and positioned below at least a top level interconnection of the multilevel interconnection structure, and the at least interconnection of the interconnection structure are connected to each other through a via plug, and that the capacitive element has a bottom electrode positioned just over a bottom contract plug just over the at least second bottom level interconnection of the interconnection structure so that the bottom electrode is electrically connected through the bottom contact plug to the at least second bottom level interconnection of the interconnection structure, and that the capacitive element has a top electrode positioned just under a top contact plug just under a just upper level interconnection of the interconnection structure so that the top electrode is electrically connected through the top contact plug to the at least horizontal position of the top contact plug centrically corresponds to a horizontal position of the bottom contact plug.

It is also preferable that the capacitive element structure is positioned above at least a second bottom level interconnection of the interconnection structure and positioned below at least a top level interconnection of the multilevel interconnection structure, and the at least second bottom level interconnection and a first bottom level interconnection of the interconnection structure are connected to each other through a via plug, and that the capacitive element has a bottom electrode positioned just over a bottom contact plug just over the at least second bottom level interconnection, of the interconnection structure so that the bottom electrode is electrically connected through the bottom, contact plug to the at least second bottom level interconnection of the interconnection structure, and that the capacitive element has a top electrode positioned just under a top contact plug just under a just upper level interconnection of the interconnection structure so that the top electrode is electrically connected through the top contact plug to the at least just upper level interconnection of the interconnection structure, and that a horizontal position of the top contact plug is eccentrically displaced from a horizontal position of the bottom contact plug.

It is also preferable that the bottom electrode is positioned just over a contact plug just over the at least bottom level interconnection of the interconnection structure so that the bottom electrode is electrically connected through the contact plug to the at least bottom level interconnection of the interconnection structure, and that the contact plug is centrically positioned with reference to the capacitive element.

It is also preferable that the bottom electrode is positioned just over a contact a plug just over the at least bottom level interconnection of the interconnection structure so that the bottom electrode is electrically connected through the contact plug to the at least bottom level interconnection of the interconnection structure, and that the contact plug is eccentrically positioned with reference to the capacitive element.

It is also preferable that the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug centrically corresponds to a horizontal position of the at least via plug, and that the at least contact plug and the at least via plug are centrically positioned with reference to the capacitive element.

It is also preferable that the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug centrically corresponds to a horizontal position of the at least via plug, and that, the at least contact plug and the at least via plug are eccentrically positioned with reference to the capacitive element.

It is also preferable that the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug is eccentrically displaced from a horizontal position of the at least via plug, and that the at least contact plug is eccentrically positioned with reference to the capacitive element whilst the at least via plug is centrically positioned with reference to the capacitive It is also preferable that the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug, just over the at least second bottom level interconnection of the interconnection structure so that the bottom electrode is electrically connected through the contact plug to the at least second bottom level interconnection of the interconnection structure, and that the at least contact plug is positioned over the, at least via plug so that a horizontal position of the at least contact plug is eccentrically displaced from a horizontal position of the at least via plug, and that the at least contact plug is centrically positioned with reference to the capacitive element whilst the at least via plug is eccentrically positioned with reference to the capacitive element.

It is also preferable that the oxide compound possesses at least any one of ferroelectric property and high dielectric property.

It is also preferable that the oxide compound is a ceramic.

It is also preferable that the capacitive element comprises a thin film capacitor.

It is also preferable, that the thin film capacitor comprises top and bottom thin film electrodes and a dielectric thin film having the same area as the top and bottom thin film electrodes.

It is also preferable to further comprise at least a diffusion barrier layer being provided between the capacitive element and the at least interconnection structure.

It is also preferable that the capacitive element structure is positioned above a second top level interconnection of the multilevel interconnection structure and below a top level interconnection of the multilevel interconnection structure, and that the top level interconnection has a terminal portion rigidly projecting in a downward direction, so that the terminal portion has a hollow and a bottom surface having the same level as a bottom of the capacitive element structure and the bottom surface is connected through a top level interconnection contact plug to the second top level interconnection.

It is also preferable that the capacitive element structure is positioned above a second top level interconnection of the multilevel interconnection structure and below a top level interconnection of the multilevel interconnection structure, and that the top level interconnection has a terminal portion rigidly projecting in a downward direction, so that the terminal portion has a hollow and a bottom surface having the same level as a top surface of the second top level interconnection of the multilevel interconnection structure whereby the bottom surface is in contact directly with the top surface of the second top level interconnection of the multilevel interconnection structure.

It is also preferable that the interconnection structure is made of a metal consisting essentially of at least any one of aluminum and copper.

It is also preferable that the interconnection structure is made of a refractory metal.

In accordance with the present invention, the ceramic thin film capacitor is positioned above the multilevel interconnection structure so that the ceramic thin film capacitor is connected through the multilevel interconnection structure to the diffusion region of the transistor formed in the substrate. This structure makes it easy to form the multilevel interconnection structure and also makes it possible to prevent any deterioration of the capacitive element.

The multilevel interconnection structure is positioned below the capacitive element, for which reason individual level interconnections of the multilevel interconnection, structure are free from the above mentioned first problems with differences in level of a top surface of the inter-layer insulator in which the interconnections are formed.

The multilevel interconnection structure has been formed before the capacitive element is formed, for which reason the capacitive element is free from the above mentioned third problem with deterioration in electrical characteristics due to tungsten via plugs.

The anneal in hydrogen containing atmosphere is carried out after the multilevel interconnection structure has been formed and before the capacitive element will be formed later, for which reason the capacitive element is free from the above mentioned fourth problem with deterioration in electrical characteristics due to a relatively high temperature heat treatment.

The ceramic thin film capacitor is positioned above the multilevel interconnection structure so that the ceramic thin film capacitor have design parameters independent from and non-associated from the logic circuit parameters, for which reason the above device is free from the above mentioned second problem in an increase in the design cost for realizing the hybrid semiconductor integrated circuits having the logic circuits and the semiconductor memories by change the process and device of the logic circuits.

The multilevel interconnection structure has been formed before the capacitive element is formed, for which reason the capacitive element is free from the above mentioned fifth problem with deterioration in electrical characteristic, due to the heat treatment for ion activation process.

The third present invention provides a semiconductor memory device having a capacitive element structure and a multilevel interconnection structure formed over at least a transistor on a semiconductor substrate, and that the capacitive element structure is positioned above the multilevel interconnection structure so that the capacitive element structure is electrically connected through the multilevel interconnection structure to the at least transistor.

It is also preferable that the capacitive element structure comprises a capacitive element having a capacitive dielectric film made of an oxide compound.

It is also preferable that the capacitive element structure is positioned above a top level interconnection of the multilevel interconnection structure.

It is also preferable that the capacitive element structure is positioned above at least a bottom level interconnection of the interconnection structure and below at least a top level interconnection of the multilevel interconnection structure.

It is also preferable that the capacitive element has a bottom electrode positioned just over a contact plug just over the at least bottom level interconnection of the interconnection structure so that the bottom electrode is electrically connected through the contact plug to the at least bottom level is interconnection of the interconnection structure.

It is also preferable that the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug, just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug centrically corresponds to a horizontal position of the at least via plug.

It is also preferable that the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned above the at least via plug so that a horizontal position of the at least contact plug centrically displaced from a horizontal position of the at least via plug.

It is also preferable that the capacitive element structure is positioned above at least a second bottom level interconnection of the interconnection structure, and positioned below at least a top level interconnection of the multilevel interconnection structure, and the at least second bottom level interconnection and a first bottom level interconnection of the interconnection structure are connected to each other through a via plug, and that the capacitive element has a bottom electrode positioned just over a bottom contact plug just over the at least second bottom level interconnection of the interconnection structure so that the bottom electrode is electrically connecting through the bottom contact plug to the at least second bottom level interconnection of the interconnection structure, and that the capacitive element has a top electrode positioned just under a top contact plug just under a just upper level interconnection of the interconnection structure so that the top electrode is electrically connected through the top contact plug to the at least just upper level interconnection of the interconnection structure, and that a horizontal position of the top contact plug centrically corresponds to a horizontal position of the bottom contact plug.

It is also preferable that the interconnection structure comprises a multilevel interconnection structure, and the capacitive element structure is positioned above at least a second bottom level interconnection of the interconnection structure and positioned below at least a top level interconnection of the multilevel interconnection structure, and the at least second bottom level interconnection connection and a first bottom level interconnection of the interconnection structure are connected to each other through a via plug, and that the capacitive element has a bottom electrode positioned just over a bottom contact plug just over the at least second bottom level interconnection of the interconnection structure so that the bottom electrode is electrically connected through the bottom contact plug to the at least second bottom level interconnection of the interconnection structure, and that the capacitive element has a top electrode positioned just under a top contact plug just under a just upper level interconnection of the interconnection structure so that the top electrode is electrically connected through the top contact plug the at least just upper level interconnection of the interconnection structure, and that a horizontal position of the top contact plug is eccentrically displaced from a horizontal position of the bottom contact plug.

It is also preferable that the capacitive element has a bottom electrode positioned just over a contact plug just over the at least bottom level interconnection of the interconnection structure so that the bottom electrode is electrically connected through the contact plug to the at least bottom level interconnection of the interconnection structure, and that the contact plug is centrically, positioned with reference to the capacitive element.

It is also preferable that the capacitive element has a bottom electrode positioned just over a contact plug just over the at least bottom level interconnection of the interconnection structure so that the bottom electrode is electrically connected through the contact plug to the at least bottom level interconnection of the interconnection structure, and that the contact plug is centrically positioned with reference to the capacitive element.

It is also preferable that the capacitive element has a bottom electrode positioned just over a contact plug just over the at least bottom level interconnection of the interconnection structure so that the bottom electrode is electrically connected through the contact plug to the at least bottom level interconnection of the interconnection structure, and that the contact plug is eccentrically positioned with reference to the capacitive element.

It is also preferable that the interconnection structure comprises a multilevel interconnection structure, and the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug centrically corresponds to a horizontal position of the at least via a plug, and that the at least contact plug and the at least via plug are eccentrically positioned with reference to the capacitive element.

It Is also preferable that the interconnection structure comprises a multilevel interconnection structure and the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug is centrically displaced from a horizontal position of the at least via plug, and that the at least contact plug and the at least via plug are eccentrically positioned with reference to the capacitive element.

It is also preferable that the interconnection structure comprises a multilevel interconnection structure, and the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug is eccentrically displaced from a horizontal position of the at least via plug, and that the at least contact plug is eccentrically positioned with reference to the capacitive element whilst the at least via plug is centrically positioned with reference to the capacitive element.

It is also preferable that the interconnection structure comprises a multilevel interconnection structure, and the capacitive element structure is positioned above at least a second bottom level interconnection of the interconnection structure, and the at least second bottom level interconnection and a first bottom level interconnection of the interconnection structure are connected to each other through a via plug, and that the capacitive element has a bottom electrode positioned just over a contact plug just over the at least second bottom level interconnection of the interconnection structure so that the bottom electrode is electrically connected through the contact plug to the at least second bottom level interconnection of the interconnection structure, and that the at least contact plug is positioned over the at least via plug so that a horizontal position of the at least contact plug is eccentrically displaced from a horizontal position of the at least via plug, and that the at least contact plug is centrically positioned with reference to the capacitive element whilst the at least via plug is eccentrically positioned with reference to the capacitive element.

It is also preferable that the oxide compound possesses at least any one of ferroelectric property and high dielectric property.

It is also preferable that the oxide compound is a ceramic.

It is also preferable that the capacitive element comprises a thin film capacitor.

It is also preferable that the thin film capacitor comprises top and bottom thin film electrodes and a dielectric thin film having the same area as the top and bottom thin film electrodes.

It is also preferable to further comprise at least a diffusion barrier layer being provided between the capacitive element and the at least interconnection structure.

It is also preferable that the interconnection structure comprises a multilevel interconnection structure, and the capacitive element structure is positioned above a second top level interconnection of the multilevel interconnection structure and below a top level interconnection of the multilevel interconnection structure, and that the top level interconnection has a terminal portion rigidly projecting in a downward direction, so that the terminal portion has a hollow and a bottom surface having the same level as a bottom of the capacitive element structure and the bottom surface is connected through a top level interconnection contact plug to the second top level interconnection.

It is also preferable that the interconnection structure comprises a multilevel interconnection structure, and the capacitive element structure is positioned above a second top level interconnection of the multilevel interconnection structure and below a top level interconnection of the multilevel interconnection structure, and that the top level interconnection has a terminal portion rigidly projecting in a downward direction, so that the terminal portion has a hollow and a bottom surface having the same level as a top surface of the second top level interconnection of the multilevel interconnection structure whereby the bottom surface is in contact directly with the top surface of the second top level interconnection of the multilevel interconnection structure.

It is also preferable that the interconnection structure is made of a metal consisting essentially of at least any one of aluminum and copper.

It is also preferable that the interconnection structure is made of a refractory metal.

In accordance with the present invention, the ceramic thin film capacitor is positioned above the multilevel interconnection structure so that the ceramic thin film capacitor is connected through the multilevel interconnection structure to the diffusion region of the transistor formed in the substrate. This structure makes it easy to form the multilevel interconnection structure and also makes it possible to prevent any deterioration of the capacitive element.

The multilevel interconnection structure is positioned below the capacitive element, for which reason individual level interconnections of the multilevel interconnection structure are free from the above mentioned first problems with differences in level of a top surface of the inter-layer insulator on which the interconnections are formed.

The multilevel interconnection structure has been formed before the capacitive element is formed, for which reason the capacitive element is free from the above mentioned third problem with deterioration in electrical characteristics due to tungsten via plugs.

The anneal in hydrogen containing atmosphere is carried out after the multilevel interconnection structure has been formed and before the capacitive element will be formed later, for which reason the capacitive element is free from the above mentioned fourth problem with deterioration in electrical characteristics due to a relatively high temperature heat treatment.

The ceramic thin film capacitor is positioned above the multilevel interconnection structure so that the ceramic thin film capacitor have design parameters independent from and non-associated from the logic circuit parameters, for which reason the above device is free from the above mentioned second problem in an increase in the design cost for realizing the hybrid semiconductor integrated circuits having the logic circuits and the semiconductor memories by change the process and device of the logic circuits.

The multilevel interconnection structure has been formed before the capacitive element is formed, for which reason the capacitive element is free from the above mentioned fifth problem with deterioration in electrical characteristics due to the heat treatment for ion activation process.

PREFERRED EMBODIMENTS

Figure 1B:
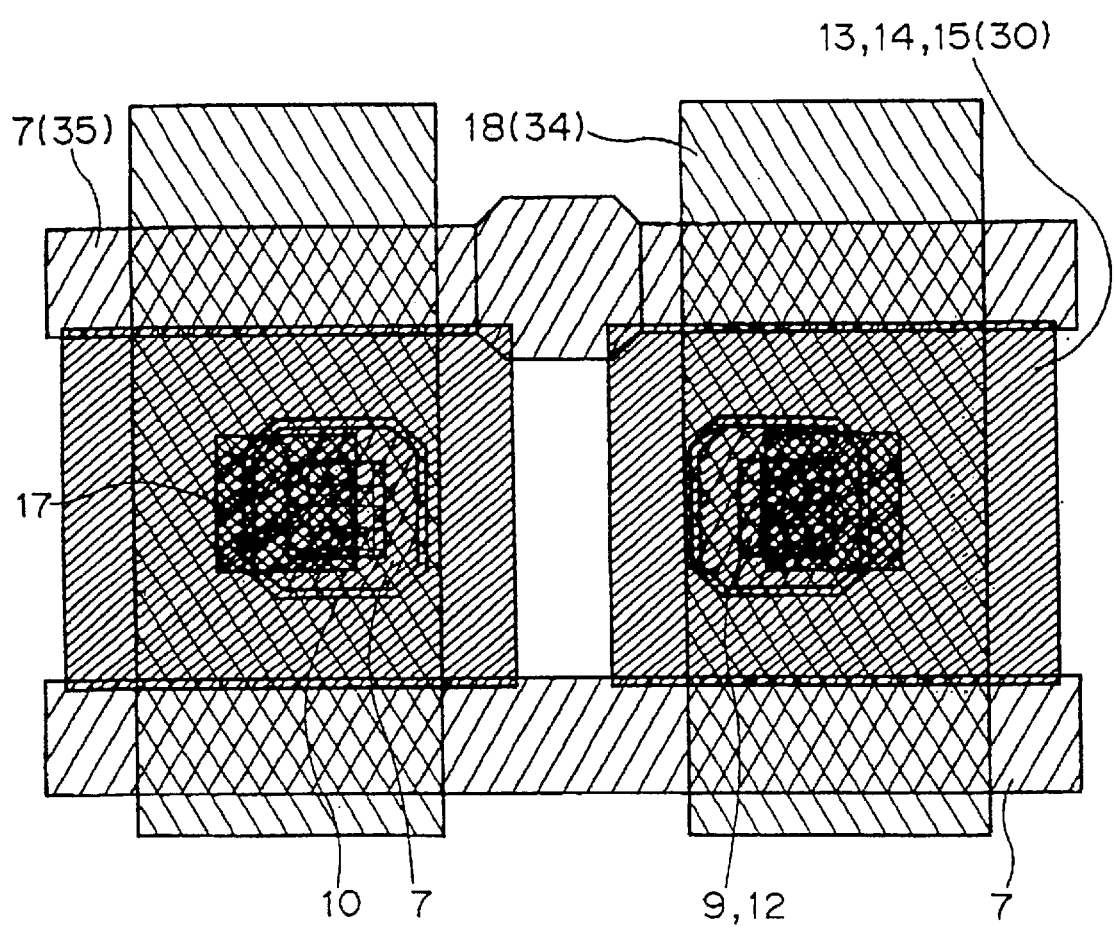
FIG. 1B is a fragmentary plane view illustrative of a memory cell of a ferroelectric memory or a dynamic random access memory at an upper part than the first level metal interconnection of a multilevel metal interconnection structure of the ferroelectric memory or the dynamic random access memory in a first embodiment in accordance with the present invention.
Figure 2:
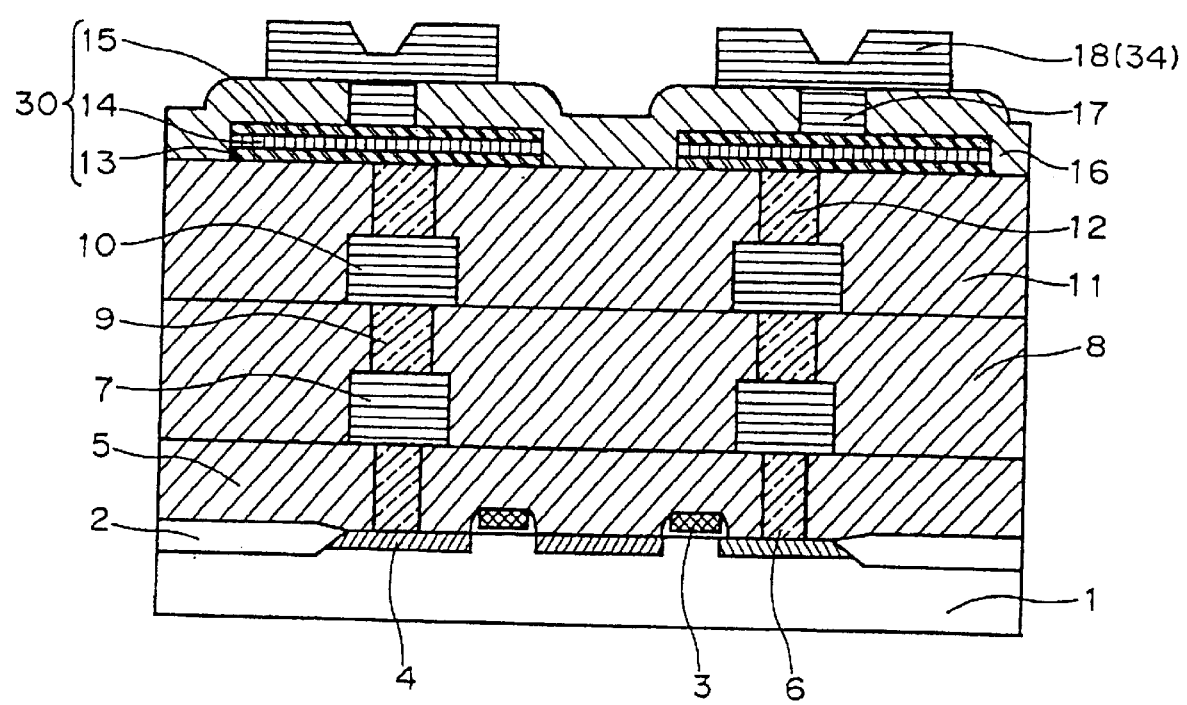
FIG. 2 is a fragmentary cross sectional elevational view illustrative of a memory cell of a ferroelectric memory or a dynamic random access memory having a multilevel metal interconnection structure and a thin film capacitive element structure, taken along an A—A line of FIGS. 1A and 1B in a first embodiment in accordance with the present invention.
Figure 3:
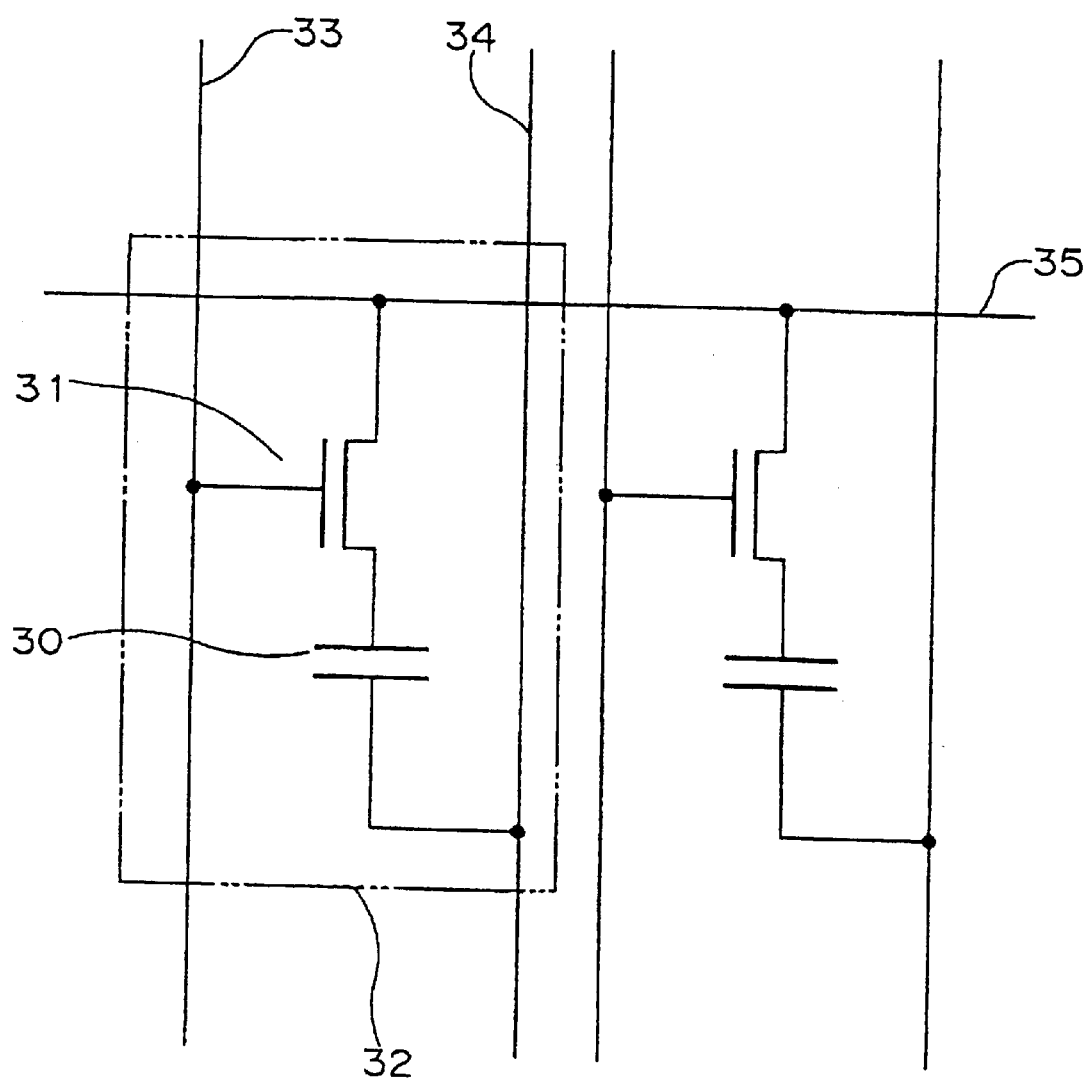
FIG. 3 is a diagram illustrative of an equivalent circuit of a Memory Cell structure of a ferroelectric memory or a dynamic random access memory having a multilevel metal interconnection structure and a thin film capacitive element structure of FIGS. 1A, 1B and 2 in a first embodiment in accordance with the present invention.

First Embodiment:

A first embodiment according to the present invention will be described in detail with reference to FIGS. 1A, 1B, 2 and 3. FIG. 1A is a fragmentary plane view illustrative of a memory cell of a ferroelectric memory or a dynamic random access memory at a lower part than a first level metal interconnection of a multilevel metal interconnection structure of the ferroelectric memory or the dynamic random access memory. FIG. 1B is a fragmentary plane view illustrative of a memory cell of a ferroelectric memory or a dynamic random access memory at an upper part than the first level metal interconnection of a multilevel metal interconnection structure of the ferroelectric memory or the dynamic random access memory. FIG. 2 is a fragmentary cross sectional elevational view illustrative of a memory cell of a ferroelectric memory or a dynamic random access memory having a multilevel metal interconnection structure and a thin film capacitive element structure, taken along an A—A line of FIGS. 1A and 1B. FIG. 3 is a diagram illustrative of an equivalent circuit of a memory cell structure of a ferroelectric memory or a dynamic random access memory having a multilevel metal interconnection structure and a thin film capacitive element structure of FIGS. 1A, 1B and 2.

With reference to FIG. 3, the ferroelectric memory or a dynamic random access memory has an array of plural memory cells 32 and a set of word lines 33 extending in parallel to each other and in a first direction and a set of plural bit lines 35 extending in parallel to each other and in a second direction perpendicular to the first direction. Each of the memory cell 32 has a switching transistor 31 and a ceramic thin film capacitor 30. A gate electrode of the switching transistor 31 is connected to the word line 33. One of a source and a drain of the switching transistor 31 is connected to the bit line 35. The remaining one of the source and the drain of the switching transistor 31 is connected through a ceramic thin film capacitor 30 to a plate line 34 adjacent to the bit line 34 to which the gate electrode is connected.

With reference to FIG. 2, the ferroelectric memory or the dynamic random access memory is provided on a semiconductor substrate 1. Field oxide films 2 are selectively formed on a top surface of the semiconductor substrate 1 to define an active region surrounded by the field oxide films 2. A plurality of MOS field effect transistors as switching transistors are formed on the active region of the semiconductor substrate 1. A multilevel interconnection structure and a multilevel inter-layer insulator structure are formed over the semiconductor substrate 1. Each of the MOS field effect transistor as a switching transistor has a gate electrode 3 and source/drain diffusion regions 4.

A first level inter-layer insulator 5 is formed over the semiconductor substrate 1. The first level inter-layer insulator 5 has first level contact holes positioned over one of the source/drain diffusion regions 4. First level contact plugs 6 are provided in the first level contact holes formed in the first level inter-layer insulator 5 so that bottoms of the first level contact plugs 6 are in contact with the source/drain diffusion regions 4. First level metal interconnections 7 are provided on the first level inter-layer insulator 5 so that the first level metal interconnections 7 are positioned over the first level contact plugs 6, wherein bottoms of the first level metal interconnections 7 are in contact with tops of the first level contact plugs 6, so that the first level metal interconnections 7 are electrically connected through the first level contact plugs 6 to the source/drain diffusion regions 4. Each of the first level metal interconnections 7 comprises a barrier metal layer such as a Ti layer and an alloy layer consisting essentially of Al or Cu. The first level contact plugs 6 are made of tungsten.

A second level inter-layer insulator 8 is provided on the first level inter-layer insulator 5 and the first level metal interconnections 7. The second level inter-layer insulator 8 has second level via holes positioned over the first level metal interconnections 7. Second level via plugs 9 are provided in the second level via holes formed in the second level inter-layer insulator 8 so that bottoms of the second level via plugs 9 are in contact with tops of the first level metal interconnections 7. Second level metal interconnections 10 are provided on the second level inter-layer insulator 8 so that the second level metal interconnections 10 are positioned over the second level via plugs 9, wherein bottoms of the second level metal interconnections 10 are in contact with tops of the second level via plugs 9, so that the second level metal interconnections 10 are electrically connected through the second level via plugs 9 to the first level metal interconnections 7. Each of the second level metal interconnections 10 comprises a barrier metal layer such as a Ti layer and an alloy layer consisting essentially of Al or Cu. The second layer via plugs 9 are made of tungsten.

A third level inter-layer insulator 11 is provided on the second level inter-layer insulator 8 and the second level metal interconnections 10. The third level inter-layer insulator 11 has third level contact holes positioned over the second level metal interconnections 10. Third level via plugs 12 are provided in the third level contact holes formed in the third level inter-layer insulator 10 so that bottoms of the third level via plugs 12 are in contact with tops of the second level metal interconnections 10. Ceramic thin film capacitors 30 are provided on the third level inter-layer insulator 11 so that the third level metal interconnections 11 are positioned over the third level via plugs 10. Each of the ceramic thin film capacitors 30 comprises complete laminations of a bottom thin film electrode 13, a ceramic thin film 14 as a dielectric layer and a top thin film electrode 15. The bottom thin film electrode 13, the ceramic thin film 14 and the top thin film electrode 15 have the same area so as to form a complete lamination. The bottom thin film electrodes of the ceramic thin film capacitors 30 are in contact with tops of the third level contact plugs 12, so that the bottom thin film electrodes of the ceramic thin film capacitors 30 are electrically connected through the third level contact plugs 12 to the second level metal interconnections 10. As described above the second level metal interconnections 10 are electrically connected through the second level via plugs 9 to the first level metal interconnections 7. Further, the first level metal interconnections 7 are electrically connected through the first level contact plugs 6 to the source/drain diffusion regions 4. As a result, the ceramic thin film capacitors 30 are electrically connected through the third level contact plugs 12, the second level via plugs 9 and the first level contact plugs 6 to the source/drain diffusion regions 4.

A fourth level inter-layer insulator 16 is provided on the third level inter-layer insulator 11 and the ceramic thin film capacitors 30. The fourth level inter-layer insulator 16 has fourth level contact holes positioned over the ceramic thin film capacitors 30. Fourth level contact plugs 17 are provided in the fourth level contact holes formed in the fourth level inter-layer insulator 16 so that bottoms of the fourth level via plugs 17 are in contact with tops of the ceramic thin film capacitors 30. Third level interconnections 18 serving as plate interconnections 34 are provided on the fourth level inter-layer insulator 16 so that the third level metal interconnections 18 serving as the plate interconnections 34 are positioned over the fourth level contact plugs 17. Bottoms of the third level metal interconnections 18 serving as plate interconnections 34 are in contact with tops of the fourth level contact plugs 17, so that the third level metal interconnections 18 serving as plate interconnections 34 are electrically connected through the fourth level contact plugs 17 to the ceramic thin film capacitors 30.

The first level contact plugs 6, the second level via plugs 9 and the third level contact plugs 12 are eccentrically positioned with reference to the ceramic thin film capacitors 30 so that it is possible to increase the area of the ceramic thin film capacitor 30 with increase in density of integration of the MOS field effect transistors. This makes it possible to increase the capacitance of the individual ceramic thin film capacitors 30 with no increase in area of the individual memory cells of the ferroelectric memory device or the dynamic random access memory. Namely, it is possible to increase the capacitance of the individual ceramic thin film capacitors 30 with an increase in density of the integration of the memory cells of the ferroelectric memory device or the dynamic random access memory. It is also possible to enlarge a margin between adjacent two of the ceramic thin film capacitors 30.

The fourth level contact plugs 17 are centrically positioned with reference to the ceramic thin film capacitors 30 and are eccentrically positioned from the first level contact plugs 6, the second level via plugs 9 and the third level contact plugs 12, so that it is possible to enlarge a margin between the fourth level contact plug 17 and the ceramic thin film capacitor 30. It is also possible to enlarge a margin between adjacent two of the third level metal interconnections 18 serving as plate interconnections 34.

A method of fabricating the above semiconductor memory device will be described with reference to FIGS. 4A through 4F which are fragmentary cross sectional elevation views illustrative of semiconductor memory devices of FIGS. 1A, 1B and 2 in sequential steps involved in a novel fabrication method thereof.

Figure 4A:
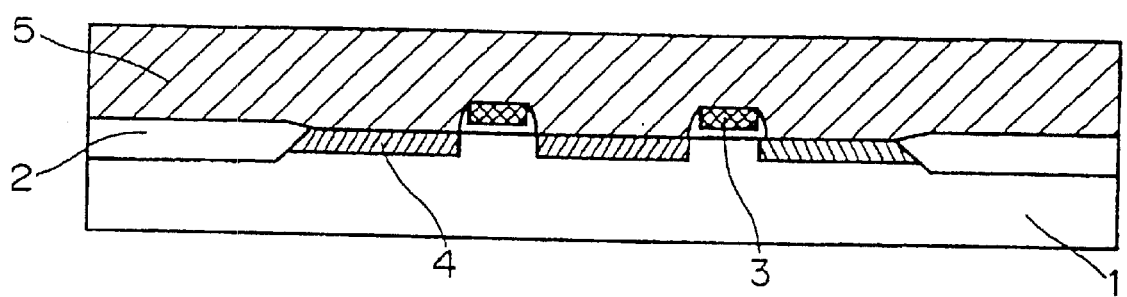
FIGS. 4A through 4F which are fragmentary cross sectional elevation views illustrative of semiconductor memory devices of FIGS. 1A, 1B and 2 in sequential steps involved in a novel fabrication method thereof in a first embodiment in accordance with the present invention.

With reference to FIG. 4A, the ferroelectric memory or the dynamic random access memory is formed on a semiconductor substrate 1. Field oxide films 2 are selectively formed on a top surface of the semiconductor substrate 1 to define an active region surrounded by the field oxide films 2. A plurality of MOS field effect transistors as switching transistors are formed on the active region of the semiconductor substrate 1. A multilevel interconnection structure and a multilevel inter-layer insulator structure are formed over the semiconductor substrate 1. Each of the MOS field effect transistor as a switching transistor has a gate electrode 3 and source/drain diffusion regions 4. A first level inter-layer insulator 5 is formed over the semiconductor substrate 1. A surface of the first level inter-layer insulator 5 is planarized by a chemical mechanical polishing method and a subsequent re-flow process.

Figure 4B:
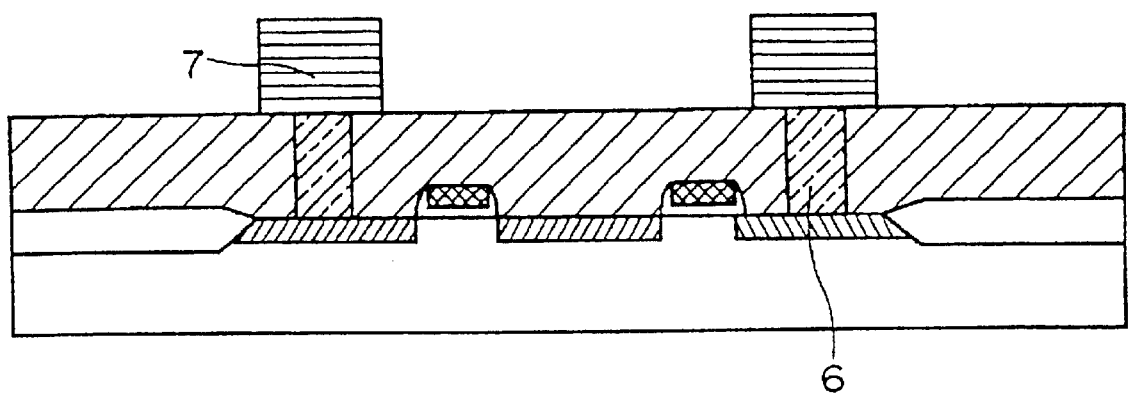

With reference to FIG. 4B, first level contact holes are formed in the first level inter-layer insulator 5 so that the first level contact holes are positioned over one of the source/drain diffusion regions 4. First level contact plugs 6 made of tungsten are formed in the first level contact holes formed in the first level inter-layer insulator 5 so that bottoms of the first level contact plugs 6 are in contact with the source/drain diffusion regions 4.

The first level contact plugs 6 may be formed as follows. A thin barrier metal layer made of Ti or TiN is entirely formed not only over the top surface of the first level inter-layer insulator 5 but also on vertical side walls and bottoms of the first level contact holes formed in the first level inter-layer insulator 5. A tungsten film is entirely deposited by a chemical vapor deposition method on the barrier metal layer so that the tungsten film fills within the first level contact holes and extends over the barrier layer over the first level inter-layer insulator 5. Laminations of the barrier layer and the tungsten film over the first level inter-layer insulator 5 are removed by etch-back process so that the laminations of the barrier layer and the tungsten film remain only within the first level contact holes formed in the first level inter-layer insulator 5, whereby the first level tungsten contact plugs 6 are selectively formed within the first level contact holes formed in the first level inter-layer insulator 5.

Alternatively, the first level contact plugs 6 may be formed by a selective growth of tungsten only within the first level contact holes formed in the first level inter-layer insulator 5.

First level metal interconnections 7 are formed on the first level inter-layer insulator 5 so that the first level metal interconnections 7 are positioned over the first level contact plugs 6, wherein bottoms of the first level metal interconnections 7 are in contact with tops of the first level contact plugs 6, so that the first level metal interconnections 7 are electrically connected through the first level contact plugs 6 to the source/drain diffusion regions 4. A first level metal interconnections 7 may comprise laminations of a barrier metal layer made of Ti or TiN, an alloy layer essentially consisting of Al or Cu, and an anti-reflecting layer made of TiN. The laminations of the barrier metal layer made of Ti or TiN, the alloy layer essentially consisting of Al or Cu, and the anti-reflecting layer made of TiN may be deposited by a sputtering method or a chemical vapor deposition method.

Alternatively, the first level contact plugs 6 and the first level metal interconnections 7 may be formed by a dual damascene method, wherein the first level inter-layer insulator 5 is shaped to have first level contact holes before a metal layer is deposited not only over the first level inter-layer insulator 5 but also within the first level contact holes in the first level inter-layer insulator 5. The metal layer is then selectively removed or etched to form concurrently both the first level contact plugs 6 and the first level metal interconnections 7.

Figure 4C:
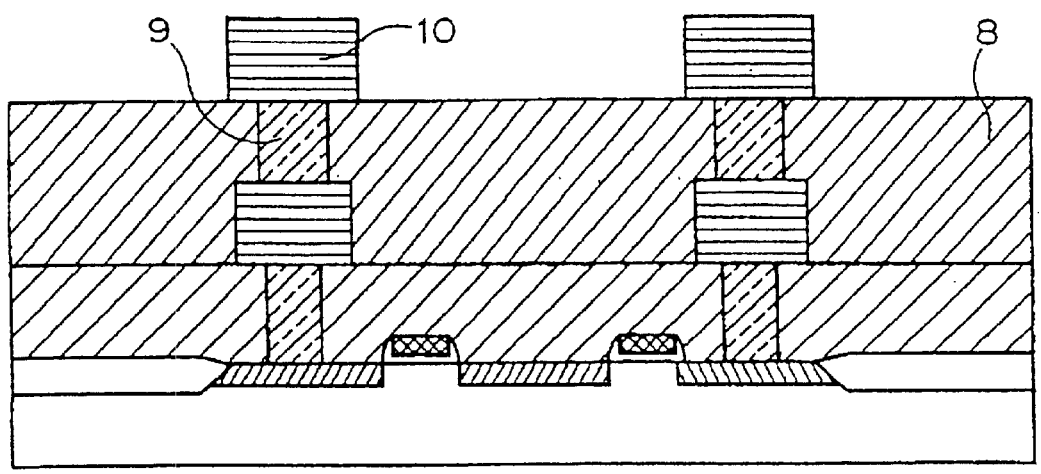

With reference to FIG. 4C, a second level inter-layer insulator 8 is formed on the first level inter-layer insulator 5 and the first level metal interconnections 7. A surface of the second level inter-layer insulator 8 is planarized by a chemical mechanical polishing method and a subsequent re-flow process. Second level via holes are formed in the second level inter-layer insulator 8 so that the second level via holes are positioned over the first level metal interconnections 7. Second level via plugs 9 are formed in the second level via holes formed in the second level inter-layer insulator 8 so that bottoms of the second level via plugs 9 are in contact with tops of the first level metal interconnections 7. Second level metal interconnections 10 are formed on the second level inter-layer insulator 8 so that the second level metal interconnections 10 are positioned over the second level via plugs 9, wherein bottoms of the second level metal interconnections 10 are in contact with tops of the second level via plugs 9, so that the second level metal interconnections 10 are electrically connected through the second level via plugs 9 to the first level metal interconnections 7.

Figure 4D:
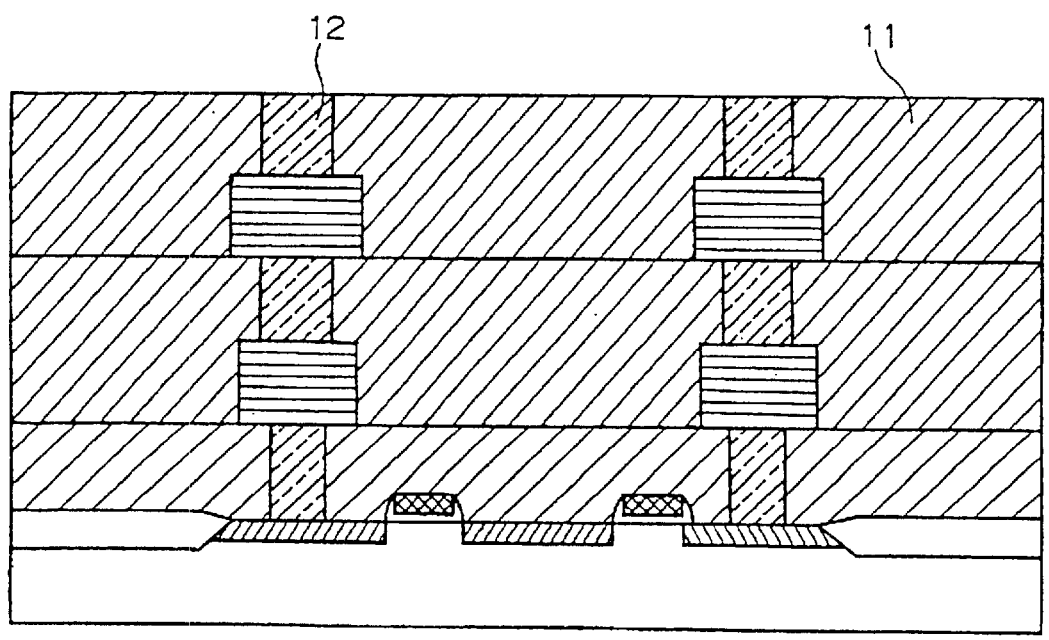

With reference to FIG. 4D, a third level inter-layer insulator 11 is formed on the second level inter-layer insulator 8 and the second level metal interconnections 10. A surface of the third level inter-layer insulator 11 is planarized by a chemical mechanical polishing method and a subsequent re-flow process. Third level contact holes are formed in the third level inter-layer insulator 11 so that the third level contact holes positioned over the second level metal interconnections 10. Third level via plugs 12 are formed in the third level contact holes formed in the third level inter-layer insulator 10 so that bottoms of the third level via plugs 12 are in contact with tops of the second level metal interconnections 10.

An anneal is carried out at a temperature in the range of 300–500° C. in a hydrogen containing atmosphere. If the temperature is below 300° C., then the effect for improvement in characteristic of the transistors is insufficient. If the temperature is above 500° C., it is possible that any disconnection appear on the first level metal interconnections 7 and the second level metal interconnections 10.

Figure 4E:
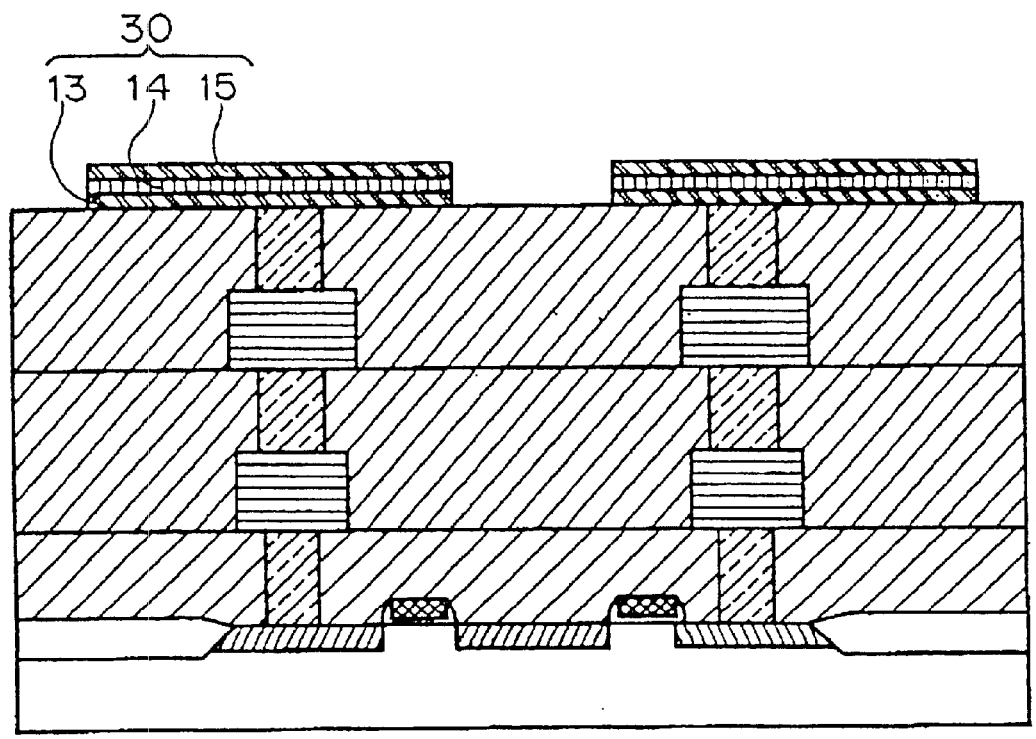

With reference to FIG. 4E, ceramic thin film capacitors 30 are formed on the third level inter-layer insulator 11 so that the third level metal interconnections 11 are positioned over the third level via plugs 10. Each of the ceramic thin film capacitors 30 comprises complete laminations of a bottom thin film electrode 13, a ceramic thin film 14 as a dielectric layer and a top thin film electrode 15. The bottom thin film electrode 13, the ceramic thin film 14 and the top thin film electrode 15 have the same area so as to form a complete lamination. The bottom thin film electrodes of the ceramic thin film capacitors 30 are in contact with tops of the third level contact plugs 12, so that the bottom thin film electrodes of the ceramic thin film capacitors 30 are electrically connected through the third level contact plugs 12 to the second level metal interconnections 10. As described above the second level metal interconnections 10 are electrically connected through the second level via plugs 9 to the first level metal interconnections 7. Further, the first level metal interconnections 7 are electrically connected through the first level contact plugs 6 to the source/drain diffusion regions 4. As a result, the ceramic thin film capacitors 30 are electrically connected through the third level contact plugs 12, the second level via plugs 9 and the first level contact plugs 6 to the source/drain diffusion regions 4.

The above ceramic thin film capacitors 30 may be made as follows. A bottom electrode 13 made of Ir, $IrO_3$, Ru, or $RuO_3$ is deposited by a sputtering method. A ceramic thin film 14 made of oxide compound such as PZT is deposited by a chemical vapor deposition at a relatively low temperature, for example, about 400° C. The deposition at the low temperature is preferable for preventing disconnection of the metal interconnection and increase in resistance of the metal interconnection. A top electrode 15 is deposited on the ceramic thin film 14 in the same manner as the bottom electrode 13 to form laminations of the bottom electrode 13, the ceramic thin film 14 and the top electrode 15. The laminations are then selectively etched to pattern the same thereby forming the ceramic thin film capacitor 30.

Figure 4F:
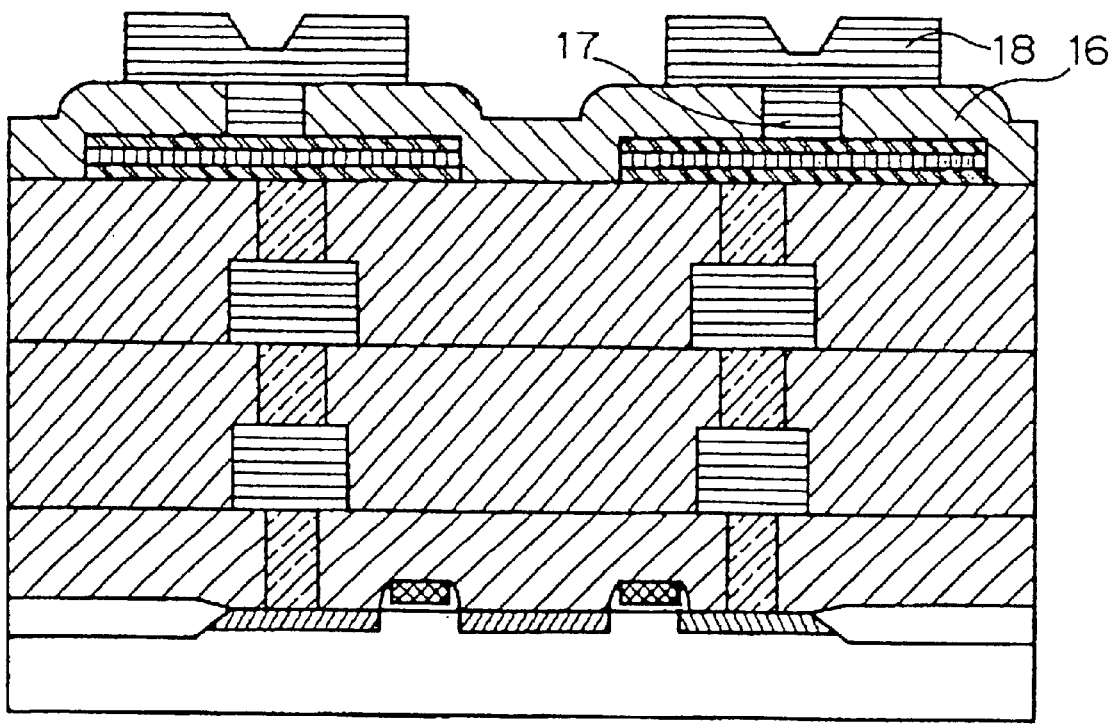

With reference to FIG. 4F, a fourth level inter-layer insulator 16 is formed on the third level inter-layer insulator 11 and the ceramic thin film capacitors 30. Fourth level contact holes are formed in the fourth level inter-layer insulator 16 so that the fourth level contact holes are positioned over the ceramic thin film capacitors 30. Fourth level contact plugs 17 are formed in the fourth level contact holes formed in the fourth level inter-layer insulator 16 so that bottoms of the fourth level via plugs 17 are in contact with tops of the ceramic thin film capacitors 30. Third level interconnections 18 serving as plate interconnections 34 are formed on the fourth level inter-layer insulator 16 in the same manner as the first and second level metal interconnection layers 7 and 10 so that the third level metal interconnections 18 serving as the plate interconnections 34 are positioned over the fourth level contact plugs 17. Bottoms of the third level metal interconnections 18 serving as plate interconnections 34 are in contact with tops of the fourth level contact plugs 17, so that the third level metal interconnections 18 serving as plate interconnections 34 are electrically connected through the fourth level contact plugs 17 to the ceramic thin film capacitors 30. A passivation film not illustrated is formed which covers the third level metal interconnections 18 serving as plate interconnections 34 and the fourth level inter-layer insulator 16.

Figure 5:
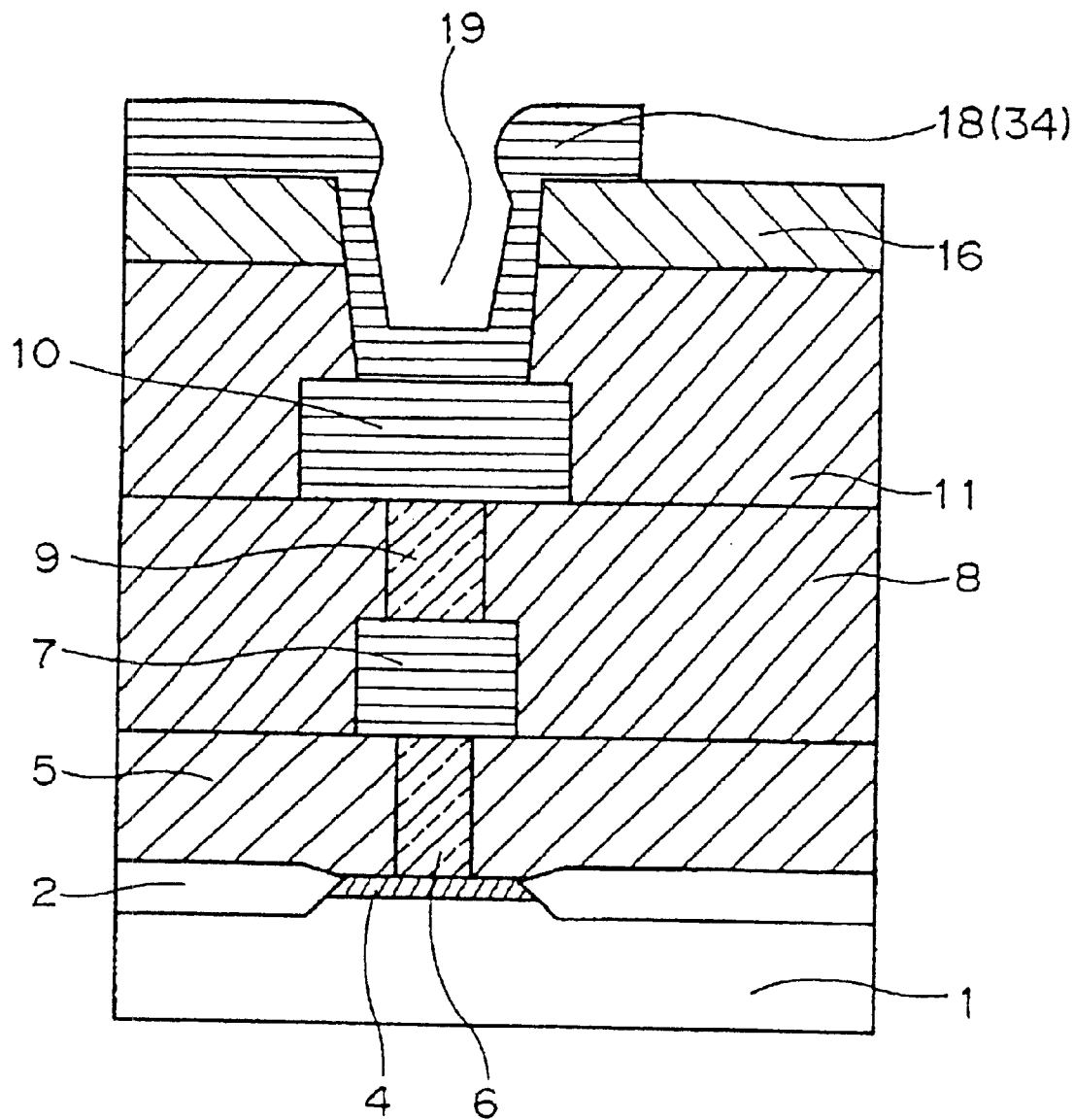
FIG. 5 is a fragmentary cross sectional elevation view illustrative of a connection structure between a plate interconnection as a third level metal interconnection and one of source/drain diffusions of switching transistors in a ferroelectric memory device or a dynamic random access memory in a first embodiment in accordance with the present invention.

The plate interconnection 34 is connected at a terminal of the cell array to an invertor circuit of a plate interconnection driving circuit. The plate interconnection 34 is electrically connected to one of the source/drain diffusion regions of the switching transistor. FIG. 5 is a fragmentary cross sectional elevation view illustrative of a connection structure between a plate interconnection as a third level metal interconnection and one of source/drain diffusions of switching transistors in a ferroelectric memory device or a dynamic random access memory.

The plate interconnection 34 has a plate interconnection contact portion 19 which rigidly projecting in a downward direction so that the plate interconnection contact portion 19 penetrates the fourth level inter-layer insulator 16 and enters into the third level inter-layer insulator 11, whereby a bottom of the plate interconnection contact portion 19 reaches a top surface of the second level metal interconnection 10. The bottom of the plate interconnection contact portion 19 is in directly contact with a top surface of the second level metal interconnection 10, so that the plate interconnection 34 is electrically connected to the second level metal interconnection 10. As described above, the second level metal interconnection 10 is electrically connected through the second level via plug 9 to the first level metal interconnection 7. Further, the first level metal interconnection 7 is electrically connected through the first level contact plug 6 to one of the source/drain diffusion regions 4 of the switching transistor. Thus, the plate interconnection 34 is electrically connected indirectly to the one of the source/drain diffusion regions 4 of the switching transistor.

The above plate interconnection contact portion 19 of the plate interconnection 34 may be formed as follows. The fourth level inter-layer insulator is formed over the ceramic thin film capacitors 30 before fourth level contact holes and plate interconnection contact holes are formed. Thereafter, the fourth level contact plugs 17 and the plate interconnection contact portion 19 of the plate interconnection 34 are concurrently formed.

Figure 6:
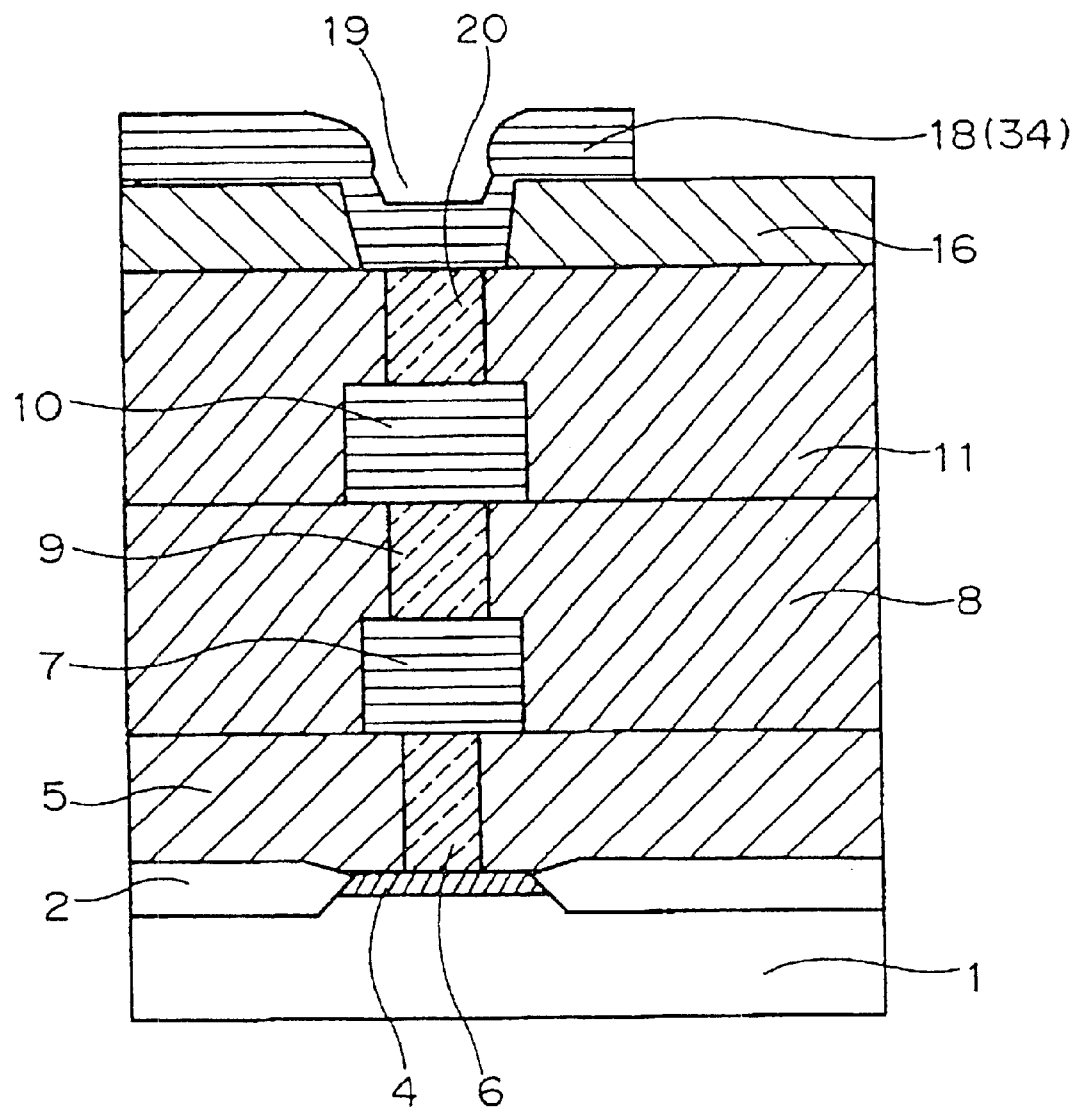
FIG. 6 is a fragmentary cross sectional elevation view illustrative of another connection structure between a plate interconnection as a third level metal interconnection and one of source/drain diffusions of switching transistors in a ferroelectric memory device or a dynamic random access memory in a first embodiment in accordance with the present invention.

FIG. 6 is a fragmentary cross sectional elevation view illustrative of another connection structure between a plate interconnection as a third level metal interconnection and one of source/drain diffusions of switching transistors in a ferroelectric memory device or a dynamic random access memory.

The plate interconnection 34 has a plate interconnection contact portion 19 which rigidly projecting in a downward direction so that the plate interconnection contact portion 19 penetrates the fourth level inter-layer insulator 16 and reaches the same level as a top surface of the third level inter-layer insulator 11, whereby a bottom of the plate interconnection contact portion 19 is in directly contact with a top surface of a third level via plug 20 on the second level metal interconnection 10, so that the plate interconnection 34 is electrically connected to the second level metal interconnection 10. As described above, the second level metal interconnection 10 is electrically connected through the second level via plug 9 to the first level metal interconnection 7. Further, the first level metal interconnection 7 is electrically connected through the first level contact plug 6 to one of the source/drain diffusion regions 4 of the switching transistor. Thus, the plate interconnection 34 is electrically connected indirectly to the one of the source/drain diffusion regions 4 of the switching transistor.

The above plate interconnection contact portion 19 of the plate interconnection 34 may be formed as follows. The fourth level inter-layer insulator is formed over the ceramic thin film capacitors 30 before fourth level contact holes and plate interconnection contact holes are formed. Thereafter, the fourth level contact plugs 17 and the fourth level via plug 20 are concurrently formed. The third level metal interconnection 18 serving as the plate interconnection 34 and the plate interconnection contact portion 19 of the plate interconnection 34 are concurrently formed.

In accordance with the above novel method, the connection is formed between the third level metal interconnection 18 and the one of the source/drain diffusion regions 4 of the switching transistor. There is no need to use a chemical vapor deposition of tungsten after the ceramic thin film capacitor 30 has been formed, for which reason the ceramic thin film capacitor 30 is free from any deterioration in characteristics due to a heat treatment.

Namely, in accordance with the above novel method, the multilevel interconnection structure has been formed before the ceramic thin film capacitor 30 is formed, for which reason any interconnection layer is free from any problem with difference in level due to existence of the thin film capacitor 30.

Further, in accordance with the above novel method, there is no need to form contact plug between the ceramic thin film capacitor and the interconnection or via plug between the interconnections after the ceramic thin film capacitor has been formed, for which reason the ceramic thin film capacitor is free from deterioration in characteristics due to chemical vapor deposition of tungsten at a relatively high temperature and a heat treatment for activation process at a relatively high temperature.

Further more, in accordance with the above novel method, the anneal in the hydrogen containing atmosphere is carried out after the multilevel interconnection structure has been formed but before the ceramic thin film capacitor is formed, for which reason it is possible to suppress variations in threshold voltage of the switching transistors and also prevent any deterioration in characteristics of the ceramic thin film capacitor.

Moreover, in accordance with the present invention, plugs providing the connection between the ceramic thin film capacitor and the switching transistor are formed during the process for forming the multilevel interconnection structure, for which reason there is no need to any additional plug for connection between the ceramic thin film capacitor and the switching transistor in other process than the process for forming the multilevel interconnection structure.

As a modification to the above embodiment, it is possible to increase the number of levels of the multilevel interconnection structure. In any modified cases, the above novel fabrication method is of course applicable and the same effects described above can be obtained. Particularly, in advanced large scale integrated circuit, local interconnections inter-connecting adjacent elements have lower levels whilst global interconnections extending over a wide region have higher levels. In this case, the upper level global interconnections have wider width and pitch than the lower level local interconnections. For this reason, if the ceramic thin film capacitor is formed above the lower level interconnection and below the higher level interconnection, then a difference in level of the inter-layer insulator overlying the ceramic thin film capacitor might not provide any influence to the formation of the upper level interconnections.

It is preferable that the upper level interconnections are formed by a sputtering method or a plating method without using any reducing atmosphere.

The above fabrication processes of the above semiconductor memory device will be described again in more detail with reference again to FIGS. 4A through 4F.

The field oxide films 2 is selectively formed on the semiconductor substrate 1 by a wet oxidation method.

Ion-implantation processes are carried out to form n-well and p-well regions in the semiconductor substrate 1. A gate oxide film is formed on the surface of the n-well and p-well regions by a wet oxidation method. A polysilicon layer is formed on the gate oxide film. The polysilicon layer is selectively etched to be patterned to form the gate electrode 3. Side wall oxide films are formed on side walls of the gate electrode 3. Ion-implantations are carried out to form n-type and p-type source/drain diffusion regions 4. A titanium film is deposited by a sputtering method and then a heat treatment is carried out to cause a silicidation reaction of Ti and Si. Unreacted Ti film is removed to form silicide layers over the n-type and p-type source/drain diffusion regions 4 as well as over the polysilicon gate electrode, whereby n-channel and p-channel MOS field effect transistors are formed on the silicon substrate 1.

The above first level metal interconnection 7 and the second level metal interconnection 10 are formed as follows. A silicon oxide film or a boro-phospho silicate glass film is deposited and then a surface thereof is planarized by a chemical mechanical polishing method. Contact holes are formed by dry etching. Impurities are separately implanted into the n-type and p-type diffusion regions 4. A rapid thermal annealing is carried out at 750° C. for 10 seconds. A Ti or TiN barrier metal layer is deposited. A tungsten film is then deposited on the barrier metal layer by a chemical vapor deposition method. The tungsten film is etched-back. An AlCu is deposited by a sputtering method and then patterned to form the first level metal interconnection 7. A second level inter-layer insulator of a silicon oxide film is deposited on the first level metal interconnection 7 by a chemical vapor deposition method. The silicon oxide film is planarized by a chemical mechanical polishing method. Via plugs 9 are formed in the silicon oxide film in the same manner as the contact plugs 6. The second level metal interconnection 10 is formed in the same manner as the first level metal interconnection 7. The third level inter-layer insulator 11 is formed and then third level contact plugs 12 are formed in the third level inter-layer insulator 11 in the same manner as the first level contact plugs 6. An anneal is carried out at 400° C. for 20 minutes in an atmosphere comprising 5% of hydrogen and 95% of nitrogen.

The ceramic thin film capacitor 30 may be formed as follows. The bottom electrode 13 of Ir or $IrO_3$ is deposited by a sputtering method. The ferroelectric thin film 14 of PZT is then deposited by a chemical vapor deposition method on the bottom electrode 13. The deposition is carried out by use of $Pb(DPM_2)$, titanium isopropoxyde, zirconium butoxyde as sources and $NO_2$ as oxidizing agent. The substrate temperature is 400° C. The ferroelectric thin film 14 and the bottom electrode 13 are etched to be patterned. The top electrode 15 of Ir or $IrO_3$ is deposited by a sputtering method on the ferroelectric thin film 14. The top electrode 15 is also etched to be patterned to form the ceramic thin film capacitor 30. The fourth level interconnection layer 16 of silicon oxide is deposited by a plasma enhanced chemical vapor deposition method before fourth level contact holes and plate interconnection contact hole are concurrently formed. The third level metal interconnection 18 of WSi/TiN/AlCu/TiN is deposited by a sputtering method and then etched. A passivation film of $SiO^2$/SiON not illustrated is then formed. Openings are formed in the passivation film to show wiring pads for evaluation and investigation on electrical characteristics of the memory device. Results of the evaluation and investigation are as follows.

5000 of PZT capacitors 30 of 1 micrometer square size are connected in parallel to measure the characteristics. A difference between inversion and non-inversion charges is 10 micro-$C/cm^2$. The PZT capacitors 30 show good ferroelectric properties. Fatigue properties and storage properties are also good. Evaluation is also made on the characteristics of the n-channel and p-channel transistors of 0.26 micrometers in gate length. Variations in threshold voltage of the n-channel and p-channel transistors over a wafer are suppressed within 10% or less.

A resistance between the second level metal interconnection 10 and the bottom electrode 13 connected through the contact plug 12 of 0.4 micrometers square size is measured by a contact chain. A resistance of the single contact plug is 10 ohms or less.

In accordance with the present invention, the ceramic thin film capacitor is positioned above the multilevel interconnection structure so that the ceramic thin film capacitor is connected through the multilevel interconnection structure to the diffusion region of the transistor formed in the substrate. This structure makes it easy to form the multilevel interconnection structure and also makes it possible to prevent any deterioration of the capacitive element.

The multilevel interconnection structure is positioned below the capacitive element, for which reason individual level interconnections of the multilevel interconnection structure are free from the above mentioned first problems with differences in level of a top surface of the inter-layer insulator on which the interconnections are formed.

The multilevel interconnection structure has been formed before the capacitive element is formed, for which reason the capacitive element is free from the above mentioned third problem with deterioration in electrical characteristics due to tungsten via plugs.

The anneal in hydrogen containing atmosphere is carried out after the multilevel interconnection structure has been formed and before the capacitive element will be formed later, for which reason the capacitive element is free from the above mentioned fourth problem with deterioration in electrical characteristics due to a relatively high temperature heat treatment.

The ceramic thin film capacitor is positioned above the multilevel interconnection structure so that the ceramic thin film capacitor have design parameters independent from and non-associated from the logic circuit parameters, for which reason the above device is free from the above mentioned second problem in an increase in the design cost for realizing the hybrid semiconductor integrated circuits having the logic circuits and the semiconductor memories by change the process and device of the logic circuits.

The multilevel interconnection structure has been formed before the capacitive element is formed, for which reason the capacitive element is free from the above mentioned fifth problem with deterioration in electrical characteristics due to the heat treatment for ion activation process.

Figure 7:
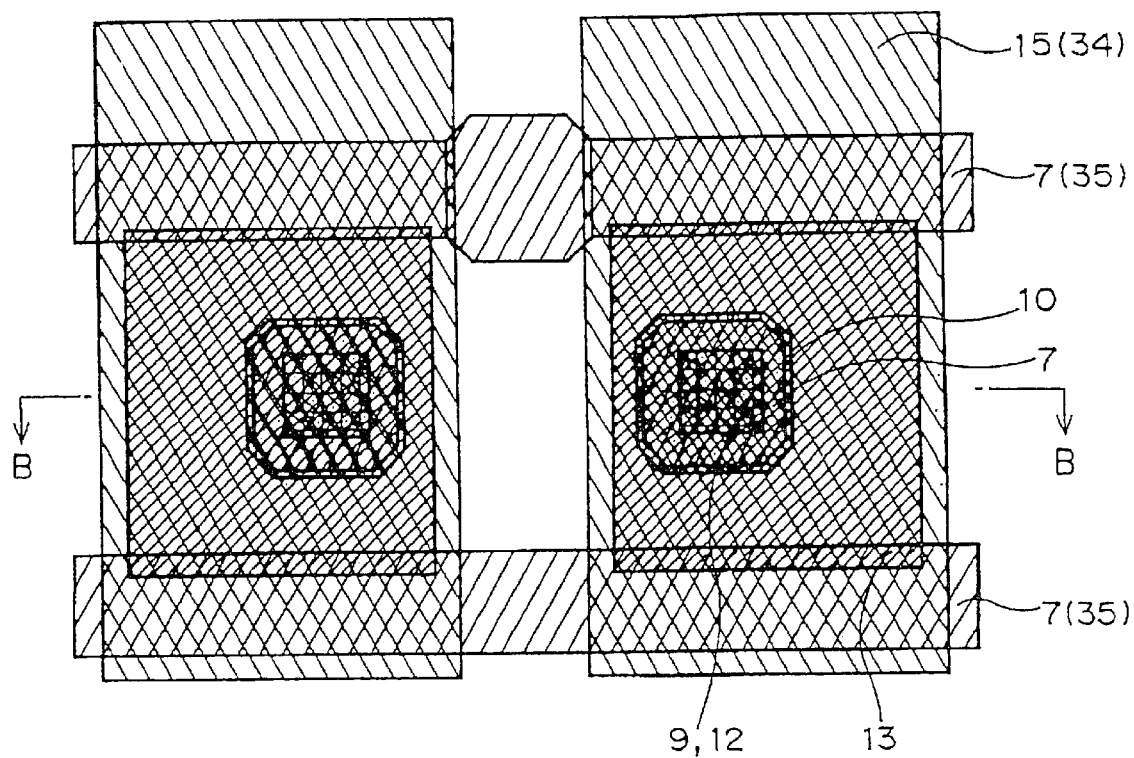
FIG. 7 is a fragmentary plane view illustrative of a memory cell of a ferroelectric memory or is dynamic random access memory at an upper part than the first level metal interconnection of a multilevel metal interconnection structure of the ferroelectric memory or the dynamic random access memory in a second embodiment in accordance with the present invention.
Figure 8:
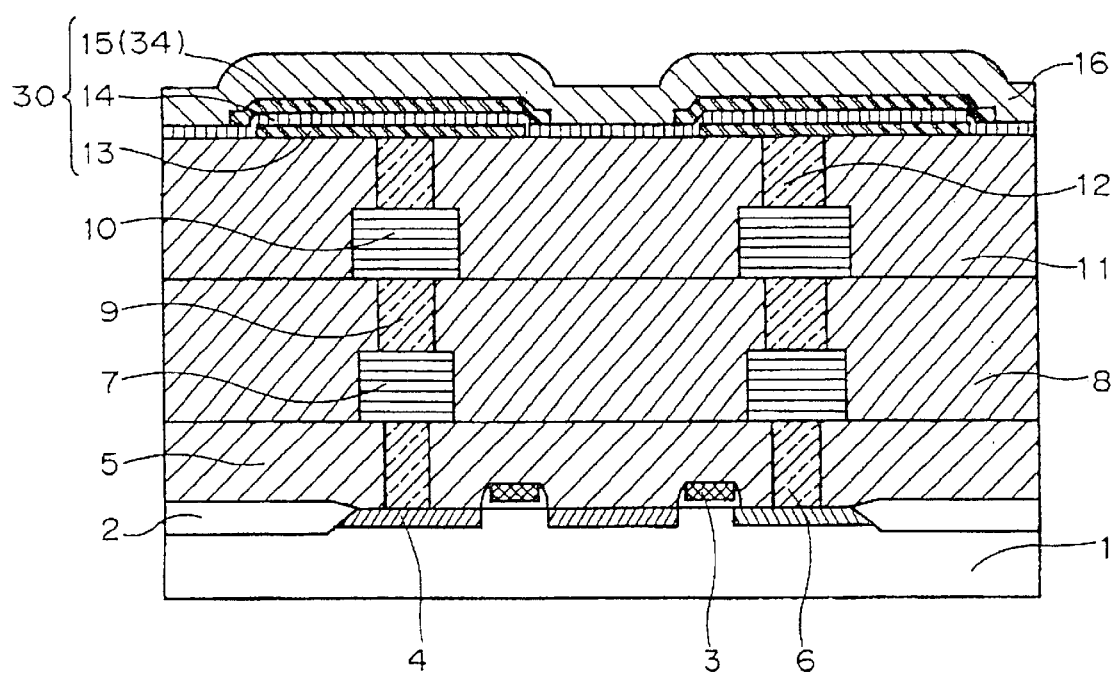
FIG. 8 is a fragmentary cross sectional elevational view illustrative of a memory cell of a ferroelectric memory or a dynamic random access memory having a multilevel metal interconnection structure and a thin film is capacitive element structure, taken along a B—B line of FIG. 7 in a second embodiment in accordance with the present invention.
Figure 9:
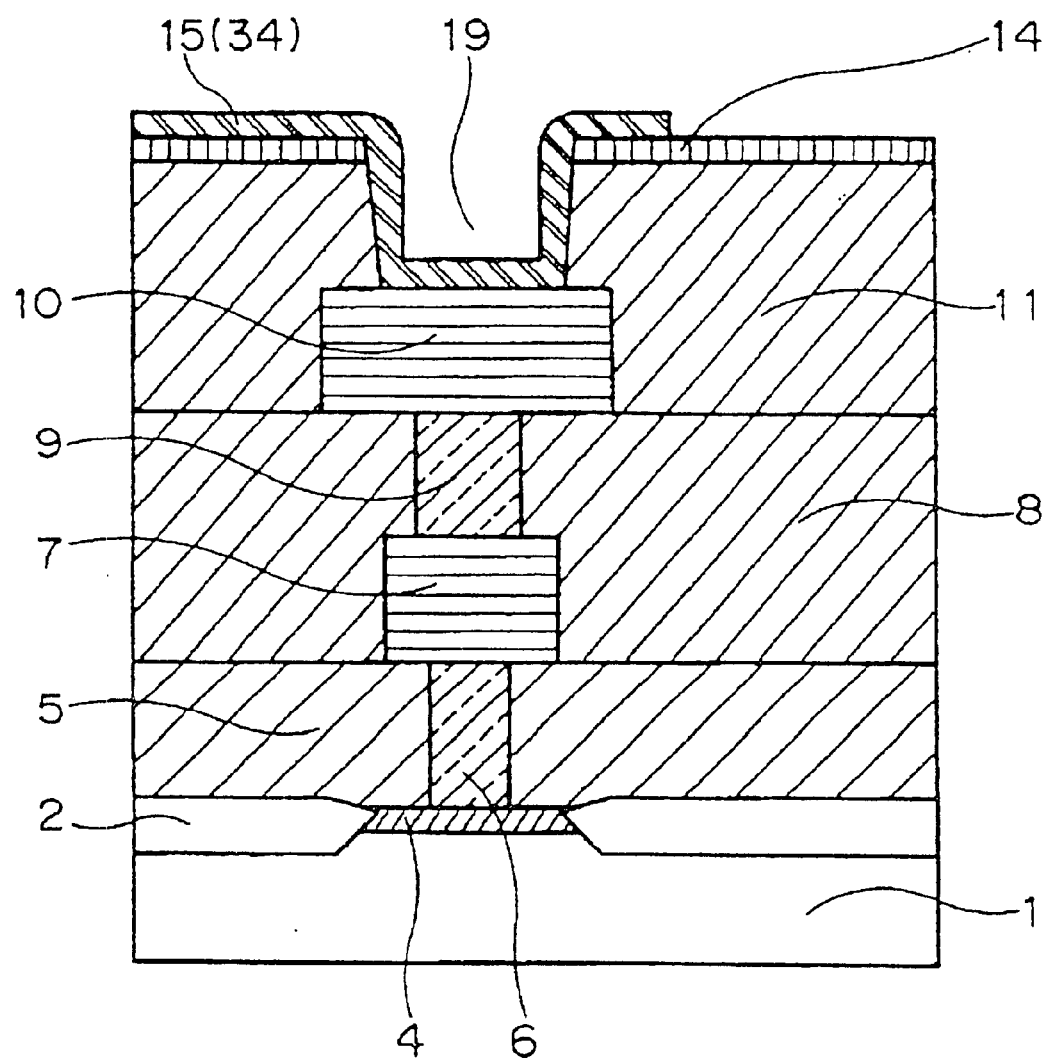
FIG. 9 is a fragmentary cross sectional elevation view illustrative of a connection structure between a plate interconnection as a third level metal interconnection and one of source/drain diffusions of switching transistors in a ferroelectric memory device or a dynamic random access memory in a second embodiment in accordance with the present invention.

Second Embodiment:

A second embodiment according to the present invention will be described in detail with reference to FIGS. 7, 8, and 9. FIG. 7 is a fragmentary plane view illustrative of a memory cell of a ferroelectric memory or a dynamic random access memory at an upper part than the first level metal interconnection of a multilevel metal interconnection structure of the ferroelectric memory or the dynamic random access memory. FIG. 8 is a fragmentary cross sectional elevational view illustrative of a memory cell of a ferroelectric memory or a dynamic random access memory having a multilevel metal interconnection structure and a thin film capacitive element structure, taken along a B—B line of FIG. 7. FIG. 9 is a fragmentary cross sectional elevation view illustrative of a connection structure between a plate interconnection as a third level metal interconnection and one of source/drain diffusions of switching transistors in a ferroelectric memory device or a dynamic random access memory.

The second embodiment is identical with the first embodiment in that the ceramic thin film capacitor is connected to the diffusion region through the via plug and contact plug. The second embodiment is different from the first embodiment in the structure of the ceramic thin film capacitor and also in fabrication process for the ceramic thin film capacitor. The ceramic thin film capacitor 30 of this embodiment has the following structure. A bottom electrode 13 is separately formed from that of an adjacent ceramic thin film capacitor, wherein the bottom electrode 13 is formed on the top surface of the third level inter-layer insulator 11. A ceramic thin film 14 is, however, entirely formed not only on the bottom electrode 13 but also on the top surface of the third level inter-layer insulator 11. The ceramic thin film 14 is common to the adjacent ceramic thin film capacitor. A top electrode 15 is separately formed from that of an adjacent ceramic thin film capacitor, wherein the top electrode 15 is formed on the top surface of the ceramic thin film 14 so that the top electrode 15 covers the bottom electrode 13. The top electrode 15 also acts as the plate interconnection 34.

This structure of the ceramic thin film capacitor 30 provides the following advantages. Namely, it is unnecessary to form a contact plug between the plate interconnection 34 and the ceramic thin film capacitor 30, whereby the structure is made single and also made easy for further scale down of the semiconductor device.

The bottom electrode 13 may be made thick to increase an effective area of the capacitor without, however, increase in area of each memory cell.

The fabrication process of this embodiment is the same as the first embodiment except for the ceramic thin film capacitor 30. The following descriptions will focus only on the fabrication process of the ceramic thin film capacitor 30.

After the third level contact plugs 12 have been formed, a bottom electrode 13 is deposited by a sputtering method on the third level inter-layer insulator 11. The bottom electrode 13 is etched to be patterned. The ceramic thin film 14 is then deposited by a chemical vapor deposition method so that the ceramic thin film 14 entirely extends over the bottom electrode 13 and the third level inter-layer insulator 11. As illustrated in FIG. 9, the top electrode 15 also acting as the plate interconnection 34 is formed so that the top electrode 15 is directly connected to the top surface o the second level interconnection 10, for which purpose after the ceramic thin film 14 has been formed then a plate interconnection contact hole is formed in the third level inter-layer insulator 11 to show the top of the second level interconnection 10. It is preferable to have removed adjacent part of the ceramic thin film 14 to the plate contact portion 19 so that it is easy to form the contact hole. The top electrode 15 is deposited by a sputtering method on the ceramic thin film 14 and then etched to form the top electrode 15 also acting as the plate interconnection 34. A passivation film not illustrated is then formed thereon.

Alternatively, it is also possible that similarly to the first embodiment, the top electrode 15 is connected through the third level metal interconnection to the second level metal interconnection 10.

It is preferable to form a diffusion barrier layer of $TiO_2$ on the third level inter-layer insulator in order to prevent any reaction between the ceramic thin film 14 and the third level inter-layer insulator 11 and also prevent any diffusion of elements such as oxygen of the ceramic thin film 14 into the third level inter-layer insulator 11.

In accordance with the present invention, the ceramic thin film capacitor is positioned above the multilevel interconnection structure so that the ceramic thin film capacitor is connected through the multilevel interconnection structure to the diffusion region of the transistor formed in the substrate. This structure makes it easy to form the multilevel interconnection structure and also makes it possible to prevent any deterioration of the capacitive element.

The multilevel interconnection structure is positioned below the capacitive element, for which reason individual level interconnections of the multilevel interconnection structure are free from the above mentioned first problems with differences in level of a top surface of the inter-layer insulator on which the interconnections are formed.

The multilevel interconnection structure has been formed before the capacitive element is formed, for which reason the capacitive element is free from the above mentioned third problem with deterioration in electrical characteristics due to tungsten via plugs.

The anneal in hydrogen containing atmosphere is carried out after the multilevel interconnection structure has been formed and before the capacitive element will be formed later, for which reason the capacitive element is free from the above mentioned fourth problem with deterioration in electrical characteristics due to a relatively high temperature heat treatment.

The ceramic thin film capacitor is positioned above the multilevel interconnection structure so that the ceramic thin film capacitor have design parameters independent from and non-associated from the logic circuit parameters, for which reason the above device is free from the above mentioned second problem in an increase in the design cost for realizing the hybrid semiconductor integrated circuits having the logic circuits and the semiconductor memories by change the process and device of the logic circuits.

The multilevel interconnection structure has been formed before the capacitive element is formed, for which reason the capacitive element is free from the above mentioned fifth problem with deterioration in electrical characteristics due to the heat treatment for ion activation process.

Figure 10A:
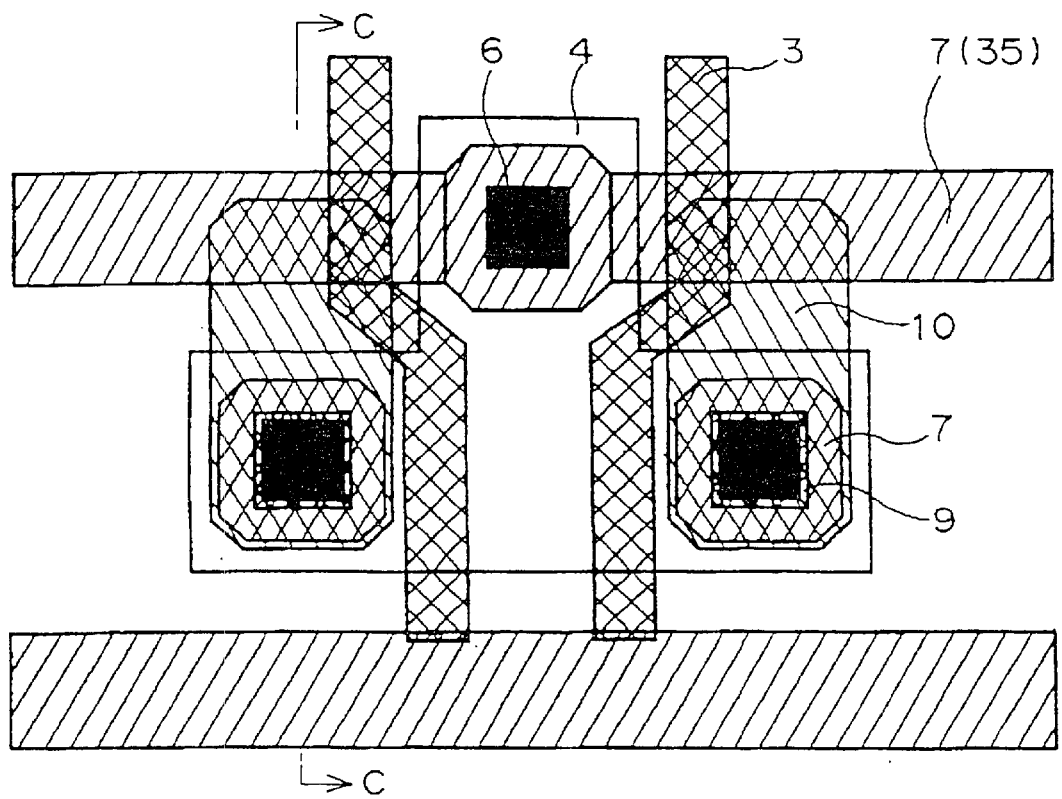
FIG. 10A is a fragmentary plane view illustrative of a memory cell of a ferroelectric memory or a dynamic random access memory at a lower pad than the second level metal interconnection of a multilevel metal interconnection structure of the ferroelectric memory or the dynamic random access memory in a third embodiment in accordance with the present invention.
Figure 10B:
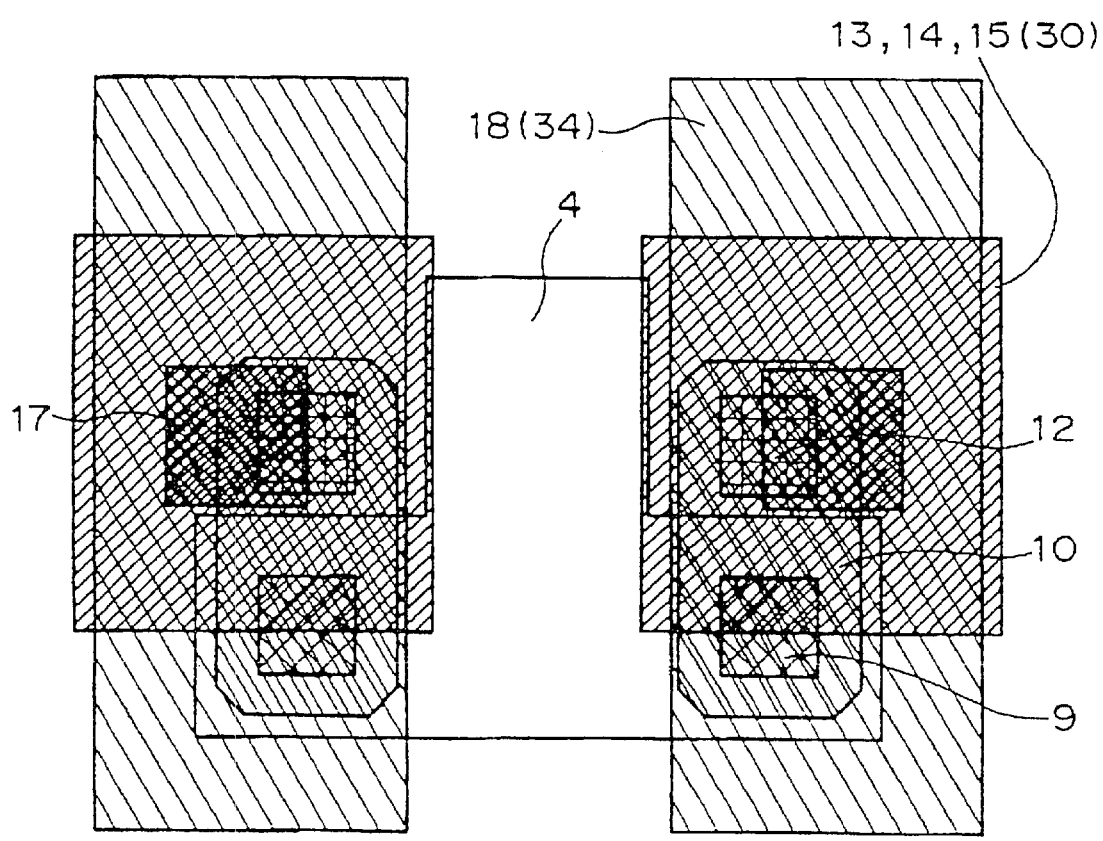
FIG. 10B is a fragmentary plane view illustrative of a memory cell of a ferroelectric memory or a dynamic random access memory at an upper part then the second level metal interconnection of a multilevel metal interconnection structure of the ferroelectric memory or the dynamic random access memory in a third embodiment in accordance with the present invention.
Figure 11:
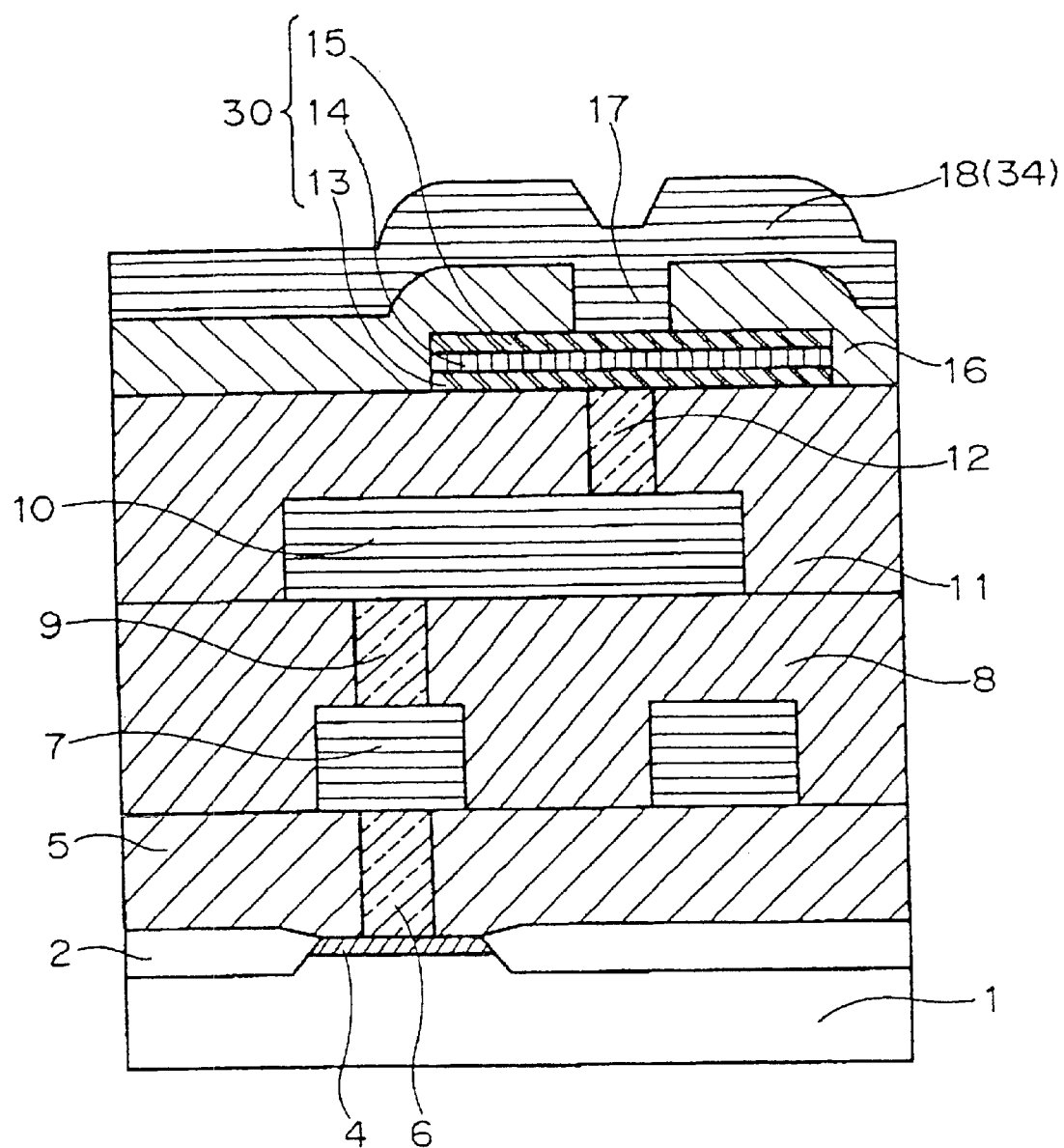
FIG. 11 is a fragmentary cross sectional elevational view illustrative of a memory cell of a ferroelectric memory or a dynamic random access memory having a multilevel metal interconnection structure and a thin film capacitive element structure taken along a C—C line of FIG. 10A in a third embodiment in accordance with the present invention.

Third Embodiment:

A third embodiment according to the present invention will be described in detail with reference to FIGS. 10A, 10B, and 11. FIG. 10A is a fragmentary plane view illustrative of a memory cell of a ferroelectric memory or a dynamic random access memory at a lower part than the second level metal interconnection of a multilevel metal interconnection structure of the ferroelectric memory or the dynamic random access memory. FIG. 10B is a fragmentary plane view illustrative of a memory cell of a ferroelectric memory or a dynamic random access memory at an upper part than the second level metal interconnection of a multilevel metal interconnection structure of the ferroelectric memory or the dynamic random access memory. FIG. 11 is a fragmentary cross sectional elevational view illustrative of a memory cell of a ferroelectric memory or a dynamic random access memory having a multilevel metal interconnection structure and a thin film capacitive element structure, taken along a C—C line of FIG. 10A.

The third embodiment is different from the first embodiment in the structure of the contact plug horizontal position and the via plug horizontal position. The first level contact plug 6 and the second level via plug 9 are centrically position in horizontal plane but are eccentrically position or displaced in horizontal plane from the third level contact plug 12 and the fourth level contact plug 17. Even if any depression appears on the second level metal interconnection 10 at just over the second level via plug 9, then the third level contact plug 12 is free from any influence to the secure electrical connection due to the depression on the second level metal interconnection 10.

The above semiconductor memory device may be fabricated in the same processes as the first embodiment.

In accordance with the present invention, the ceramic thin film capacitor is positioned above the multilevel interconnection structure so that the ceramic thin film capacitor is connected through the multilevel interconnection structure to the diffusion region of the transistor formed in the substrate. This structure makes it easy to form the multilevel interconnection structure and also makes it possible to prevent any deterioration of the capacitive element.

The multilevel interconnection structure is positioned below the capacitive element, for which reason individual level interconnections of the multilevel interconnection structure are free from the above mentioned first problems with differences in level of a top surface of the inter-layer insulator on which the interconnections are formed.

The multilevel interconnection structure has been formed before the capacitive element is formed, for which reason the capacitive element is free from the above mentioned third problem with deterioration in electrical characteristics due to tungsten via plugs.

The anneal in hydrogen containing atmosphere is carried out after the multilevel interconnection structure has been formed and before the capacitive element will be formed later, for which reason the capacitive element is free from the above mentioned fourth problem with deterioration in electrical characteristics due to a relatively high temperature heat treatment.

The ceramic thin film capacitor is positioned above the multilevel interconnection structure so that the ceramic thin film capacitor have design parameters independent from and non-associated from the logic circuit parameters, for which reason the above device is free from the above mentioned second problem in an increase in the design cost for realizing the hybrid semiconductor integrated circuits having the logic circuits and the semiconductor memories by change the process and device of the logic circuits.

The multilevel interconnection structure has been formed before the capacitive element is formed, for which reason the capacitive element is free from the above mentioned fifth problem with deterioration in electrical characteristics due to the heat treatment for ion activation process.

Figure 12:
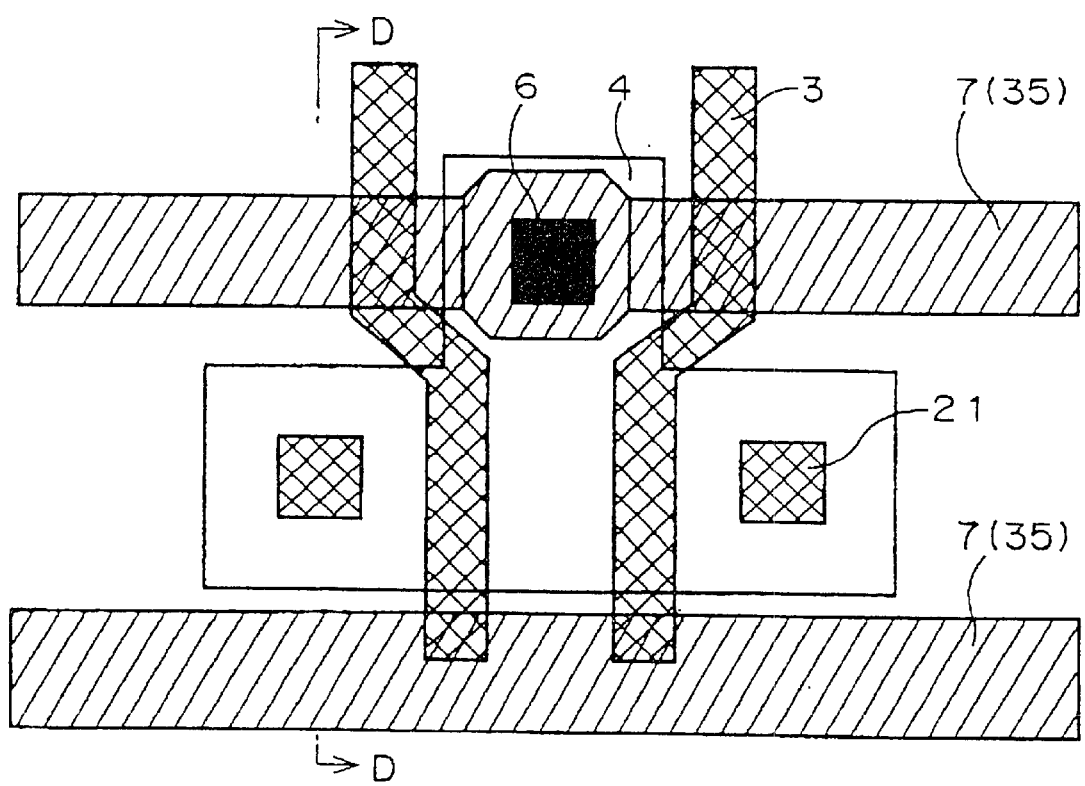
FIG. 12 is a fragmentary plane view illustrative of a memory cell of a ferroelectric memory or a dynamic random access memory at a lower part than the second level metal interconnection of a multilevel metal interconnection structure of the ferroelectric memory or the dynamic random access memory in a fourth embodiment in accordance with the present invention.
Figure 13:
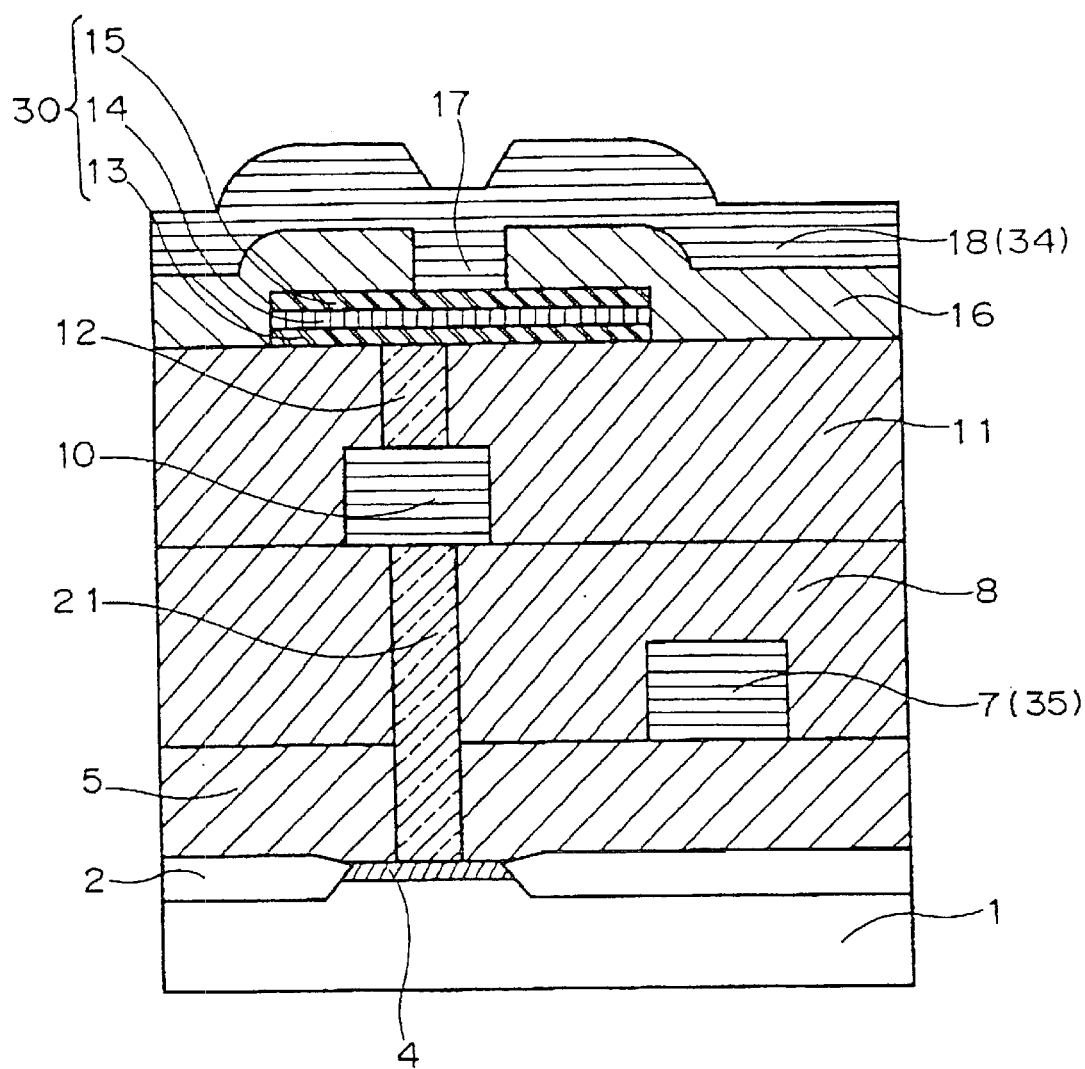
FIG. 13 is a fragmentary cross sectional elevational view illustrative of a memory cell of a ferroelectric memory or a dynamic random access memory having a multilevel metal interconnection structure and a thin film capacitive element structure, taken along a D—D line of FIG. 12 in a fourth embodiment in accordance with the present invention.

Fourth Embodiment:

A fourth embodiment according to the present invention will be described in detail with reference to FIGS. 12, and 13. FIG. 12 is a fragmentary plane view illustrative of a memory cell of a ferroelectric memory or a dynamic random access memory at a lower part than the second level metal interconnection of a multilevel metal interconnection structure of the ferroelectric memory or the dynamic random access memory. FIG. 13 is a fragmentary cross sectional elevational view illustrative of a memory cell of a ferroelectric memory or a dynamic random access memory having a multilevel metal interconnection structure and a thin film capacitive element structure, taken along a D—D line of FIG. 12.

The fourth embodiment is different from the first embodiment in that the second level metal interconnection 10 is connected through a single contact plug 21 to the diffusion region 4. This structure allows a further reduction in occupied area of each memory cell and also allows a further increase in the density of the integration of the memory cells. Namely, an adjacent first level metal interconnection 7 may be made closer to the single contact plug 21 provided that the adjacent first level metal interconnection 7 is not contact with the single contact plug 21. The adjacent first level metal interconnection 7 serves as a bit line 35.

The descriptions will focus on different process of the device from those of the first embodiment. The second level inter-layer insulator 8 is formed on the first level inter-layer insulator 5. A contact hole penetrating both the first and second level inter-layer insulators 5 and 8 is formed by a dry etching. A barrier metal layer of Ti or TiN is formed in the contact hole of a high aspect ratio by a collimator sputtering method or a chemical vapor deposition method. A tungsten film is deposited by a chemical vapor deposition method and an etch-back process is carried out to form a contact plug 21. It is possible that the contact plug 21 and the other via plug between the other multilevel interconnections may concurrently be formed. The second level metal interconnection 10 is formed on the contact plug 21. Other processes are substantially the same as the first embodiment.

In accordance with the present invention, the ceramic thin film capacitor is positioned above the multilevel interconnection structure so that the ceramic thin film capacitor is connected through the multilevel interconnection structure to the diffusion region of the transistor formed in the substrate. This structure makes it easy to form the multilevel interconnection structure and also makes it possible to prevent any deterioration of the capacitive element.

The multilevel interconnection structure is positioned below the capacitive element, for which reason individual level interconnections of the multilevel interconnection structure are free from the above mentioned first problems with differences in level of a top surface of the inter-layer insulator on which the interconnections are formed.

The multilevel interconnection structure has been formed before the capacitive element is formed, for which reason the capacitive element is free from the above mentioned third problem with deterioration in electrical characteristics due to tungsten via plugs.

The anneal in hydrogen containing atmosphere is carried out after the multilevel interconnection structure has been formed and before the capacitive element will be formed later, for which reason the capacitive element is free from the above mentioned fourth problem with deterioration in electrical characteristics due to a relatively high temperature heat treatment.

The ceramic thin film capacitor is positioned above the multilevel interconnection structure so that the ceramic thin film capacitor have design parameters independent from and non-associated from the logic circuit parameters, for which reason the above device is free from the above mentioned second problem in an increase in the design cost for realizing the hybrid semiconductor integrated circuits having the logic circuits and the semiconductor memories by change the process and device of the logic circuits.

The multilevel interconnection structure has been formed before the capacitive element is formed, for which reason the capacitive element is free from the above mentioned fifth problem with deterioration in electrical characteristics due to the heat treatment for ion activation process.

Figure 14:
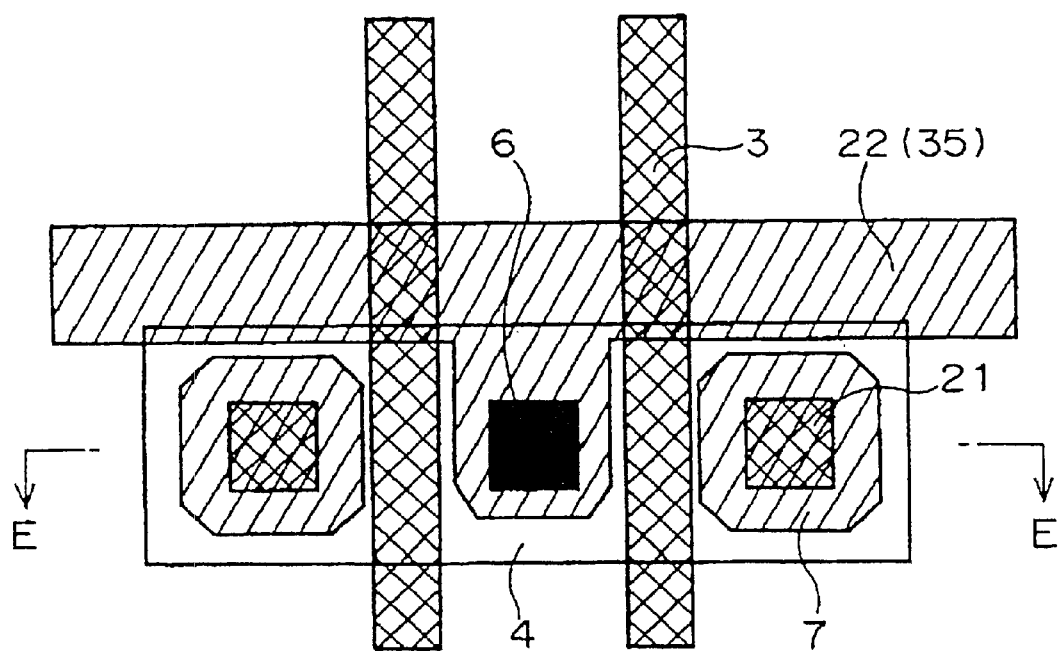
FIG. 14 is a fragmentary plane view illustrative of a memory cell of a ferroelectric memory or a dynamic random access memory at a lower part than the second level metal interconnection of a multilevel metal interconnection structure of the ferroelectric memory or the dynamic random access memory in a fifth embodiment in accordance with the present invention.
Figure 15:
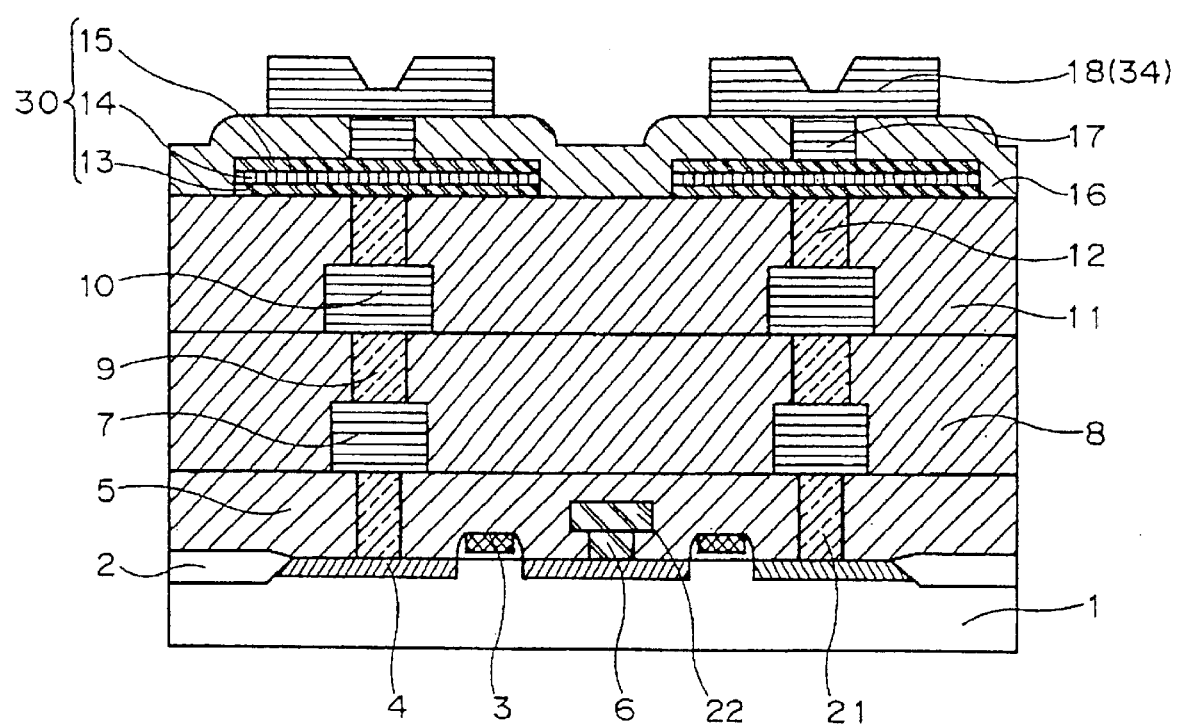
FIG. 15 is a fragmentary cross sectional elevational view illustrative of a memory cell of a ferroelectric memory or a dynamic random access memory having a multilevel metal interconnection structure and a thin film capacitive element structure, taken along an E—E line of FIG. 14 in a fifth embodiment in accordance with the present invention.

Fifth Embodiment:

A fifth embodiment according to the present invention will be described in detail with reference to FIGS. 14, and 14. FIG. 14 is a fragmentary plane view illustrative of a memory cell of a ferroelectric memory or a dynamic random access memory at a lower part than the second level metal interconnection of a multilevel metal interconnection structure of the ferroelectric memory or the dynamic random access memory. FIG. 15 is a fragmentary cross sectional elevational view illustrative of a memory cell of a ferroelectric memory or a dynamic random access memory having a multilevel metal interconnection structure and a thin film capacitive element structure, taken along an E—E of FIG. 14.

The fifth embodiment is different from the first embodiment in that a silicide interconnection 22 acting as a bit layer 35 is provided separately from the first level metal interconnection 7 so that the first level metal interconnection 7 acts exclusively for connection between the ceramic capacitor 30 and the diffusion region 4. The silicide interconnection 22 acting as the bit layer 35 is provided in the first level inter-layer insulator 5, so that the first level metal interconnection 7 is different in level from the silicide interconnection 22 acting as the bit layer 35. This structure allows a further reduction in occupied area of each memory cell and also allows a further increase in the density of the integration of the memory cells.

Fabrication processes for the above device will be made with focusing onto the difference from the first embodiment.

After the MOS field effect transistors have been formed on the silicon substrate 1. An inter-layer insulator is formed which covers the MOS field effect transistors. A contact hole is formed in the inter-layer insulator. A contact plug 6 is then formed in the contact hole. A silicide interconnection 22 made of tungsten silicide and acting as a bit line 35 is formed on the contact plug 6. A first level inter-layer insulator 5 is formed on the above inter-layer insulator. First level contact holes are formed in the first level inter-layer insulator 5 so that the first level contact holes are positioned over the diffusion regions 4. First level contact plugs 21 are formed in the first level contact holes. The following processes are the same as the first embodiment.

In accordance with the present invention, the ceramic thin film capacitor is positioned above the multilevel interconnection structure so that the ceramic thin film capacitor is connected through the multilevel interconnection structure to the diffusion region of the transistor formed in the substrate. This structure makes it easy to form the multilevel interconnection structure and also makes it possible to prevent any deterioration of the capacitive element.

The multilevel interconnection structure is positioned below the capacitive element, for which reason individual level interconnections of the multilevel interconnection structure are free from the above mentioned first problems with differences in level of a top surface of the inter-layer insulator on which the interconnections are formed.

The multilevel interconnection structure has been formed before the capacitive element is formed, for which reason the capacitive element is free from the above mentioned third problem with deterioration in electrical characteristics due to tungsten via plugs.

The anneal in hydrogen containing atmosphere is carried out after the multilevel interconnection structure has been formed and before the capacitive element will be formed later, for which reason the capacitive element is free from the above mentioned fourth problem with deterioration in electrical characteristics due to a relatively high temperature heat treatment.

The ceramic thin film capacitor is positioned above the multilevel interconnection structure so that the ceramic thin film capacitor have design parameters independent from and non-associated from the logic circuit parameters, for which reason the above device is free from the above mentioned second problem in an increase in the design cost for realizing the hybrid semiconductor integrated circuits having the logic circuits and the semiconductor memories by change the process and device of the logic circuits.

The multilevel interconnection structure has been formed before the capacitive element is formed, for which reason the capacitive element is free from the above mentioned fifth problem with deterioration in electrical characteristics due to the heat treatment for ion activation process.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device comprising:

a semiconductor substrate having an active region having a diffusion region;

a multilevel interconnection structure on said semiconductor substrate, said multilevel interconnection structure comprising at least first level and second level interconnections isolated from each other by an inter-layer insulator and electrically connected to each other through a via plug in a via hole formed in said inter-layer insulator, said first level interconnection being electrically connected to said diffusion region through a first contact plug, said first contact plug being in a first contact hole formed in a further inter-layer insulator isolating said first level interconnection from said diffusion region; and a capacitive element comprising a bottom electrode that is isolated from said multilevel interconnection structure by a yet further inter-layer insulator, said bottom electrode being electrically connected to said second level interconnection by a second contact plug in a second contact hole through the yet further inter-layer insulator.

2. The semiconductor memory device as claimed in claim 1, further comprising a third level interconnection above said capacitive element.

3. The semiconductor memory device as claimed in claim 1, wherein said second contact plug is centrically aligned with said via plug connecting said first level and said second level interconnections.

4. The semiconductor memory device as claimed in claim 1, furthering comprising a third level interconnection above said capacitive element, said capacitive element further comprising a top electrode that is isolated from the third level interconnection by a still further inter-layer insulator, said top electrode being electrically connected to said third level interconnection by a third contact plug in a third contact hole through the still further inter-layer insulator, and wherein said third contact plug is centrically aligned with said first contact plug.

5. The semiconductor memory device as claimed in claim 1, wherein said first contact plug is eccentrically aligned with said capacitive element.

6. The semiconductor memory device as claimed in claim 1,
  wherein said second contact plug is centrically aligned with said via plug connecting said first level interconnection to said second level interconnection, and
  wherein said second contact plug and said via plug connecting said first level interconnection to said second level interconnection are eccentrically aligned with said capacitive element.

7. The semiconductor memory device as claimed in claim 1, wherein said capacitive element comprises an oxide compound having a ferroelectric property.

8. The semiconductor memory device as claimed in claim 7, wherein said oxide compound is a ceramic.

9. The semiconductor memory device as claimed in claim 1, wherein said capacitive element comprises a thin film capacitor.

10. The semiconductor memory device as claimed in claim 9, wherein said thin film capacitor comprises top and bottom thin film electrodes and a dielectric thin film between said top and bottom thin film electrodes having a same area as said top and bottom thin film electrodes.

11. The semiconductor memory device as claimed in claim 1, further comprising a third level connection above said capacitive element,
  wherein said third level interconnection has a terminal portion rigidly projecting in a downward direction, said terminal portion having a hollow and a bottom surface having a same level as a bottom of said capacitive element, said bottom surface being electrically connected to said second level interconnection.

12. The semiconductor memory device as claimed in claim 1, further comprising a third level interconnection above said capacitive element,
  wherein said third level interconnection has a terminal portion rigidly projecting in a downward direction, so that said terminal portion has a hollow and a bottom surface having a same level as a top surface of said second level interconnection, said bottom surface is in contact directly with said top surface of said second level interconnection.

13. The semiconductor memory device as claimed in claim 1, wherein said interconnection structure is made of a metal consisting essentially of at least any one of aluminum and copper.

14. The semiconductor memory device as claimed in claim 1, wherein said interconnection structure is made of a refractory metal.

* * * * *